(12) United States Patent
Matsuo et al.

(10) Patent No.: US 10,772,006 B2
(45) Date of Patent: Sep. 8, 2020

(54) WIRELESS COMMUNICATION DEVICE AND WIRELESS COMMUNICATION METHOD

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventors: Ryoko Matsuo, Tokyo (JP); Takaomi Murakami, Kanagawa (JP)

(73) Assignees: KABUSHIKI KAISHA TOSHIBA, Tokyo (JP); TOSHIBA ELECTRONICS DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/919,969

(22) Filed: Mar. 13, 2018

(65) Prior Publication Data

US 2018/0279171 A1     Sep. 27, 2018

(30) Foreign Application Priority Data

Mar. 22, 2017  (JP) ................. 2017-056548

(51) Int. Cl.
*H04W 28/06* (2009.01)
*H04L 5/00* (2006.01)
(Continued)

(52) U.S. Cl.
CPC .......... *H04W 28/06* (2013.01); *H03M 13/09* (2013.01); *H04B 7/15* (2013.01); *H04B 7/15528* (2013.01);
(Continued)

(58) Field of Classification Search
CPC ....... H03M 13/09; H04B 7/0695; H04B 7/15; H04B 7/155; H04B 7/15528;
(Continued)

(56) References Cited

U.S. PATENT DOCUMENTS 6,947,768 B2     9/2005  Adachi
2009/0235138 A1*  9/2009  Chang .................. H04L 1/1854
                                                714/748
(Continued)

FOREIGN PATENT DOCUMENTS

GB      2491335 A  * 12/2012  ........... H04L 12/189
JP      2006-074820 A    3/2006
(Continued)

OTHER PUBLICATIONS

IEEE Standards Association/IEEE Computer Society: "Part 11: Wireless LAN Medium Access Control (MAC) and Physical Layer (PHY) Specifications; Amendment 4: Enhancements for Very High Throughput for Operation in Bands Below 6 GHz", IEEE Std 802.11ac™, The Institute of Electrical and Electronics Engineers, Inc., Dec. 2013, pp. 1-425.
(Continued)

*Primary Examiner* — Khoa Huynh
(74) *Attorney, Agent, or Firm* — Foley & Lardner LLP

(57) ABSTRACT

According to one embodiment, a wireless communication device includes: a receiver configured to receive a first frame which contains data; and a transmitter configured to transmit a second frame and a third frame by frequency multiplexing, the third frame containing the data and being addressed to a first relay station different from a sender device of the first frame. The second frame is a frame to instruct the sender device of the first frame to perform a frame transmission.

17 Claims, 23 Drawing Sheets

(51) Int. Cl.
*H03M 13/09* (2006.01)
*H04L 1/00* (2006.01)
*H04B 7/15* (2006.01)
*H04B 7/155* (2006.01)
*H04L 1/18* (2006.01)

(52) U.S. Cl.
CPC .......... *H04L 1/0061* (2013.01); *H04L 1/188* (2013.01); *H04L 5/0007* (2013.01); *H04L 5/0055* (2013.01); *H04L 2001/0097* (2013.01)

(58) Field of Classification Search
CPC ..... H04L 1/0061; H04L 1/1854; H04L 1/188; H04L 5/0007; H04L 5/0055; H04L 2001/0097; H04W 28/06
See application file for complete search history.

(56) References Cited

U.S. PATENT DOCUMENTS

| | | | |
|---|---|---|---|
| 2010/0014463 A1* | 1/2010 | Nagai | H04B 7/0695 370/328 |
| 2010/0271999 A1* | 10/2010 | Yu | H04B 7/155 370/312 |
| 2012/0231797 A1 | 9/2012 | Van Phan | |
| 2015/0358067 A1 | 12/2015 | Zhang | |
| 2017/0272146 A1 | 9/2017 | Matsuo | |
| 2018/0255568 A1 | 9/2018 | Takeda | |

FOREIGN PATENT DOCUMENTS

| | | |
|---|---|---|
| JP | 3774469 B2 | 5/2006 |
| JP | 2013-229681 A | 11/2013 |
| JP | 2014-107670 A | 6/2014 |
| JP | 2017-169057 A | 9/2017 |

OTHER PUBLICATIONS

IEEE Standards Association/IEEE Computer Society: "Part 11: Wireless LAN Medium Access Control (MAC) and Physical Layer (PHY) Specifications", IEEE Std 802.11™, The Institute of Electrical and Electronics Engineers, Inc., Mar. 2012, pp. 1-2793.

Non-Final Office Action on U.S. Appl. No. 15/392,424 dated Dec. 31, 2018.

Final Office Action on U.S. Appl. No. 15/392,424 dated Apr. 19, 2019.

* cited by examiner

| To DS | From DS | Address 1 | Address 2 | Address 3 | | Address 4 | |
|---|---|---|---|---|---|---|---|
| | | | | MSDU case | A-MSDU case | MSDU case | A-MSDU case |
| 0 | 0 | RA=DA | TA=SA | BSSID | BSSID | N/A | N/A |
| 0 | 1 | RA=DA | TA=BSSID | SA | BSSID | N/A | N/A |
| 1 | 0 | RA=BSSID | TA=SA | DA | BSSID | N/A | N/A |
| 1 | 1 | RA | TA | DA | BSSID | SA | BSSID |

| RU# 1 | RU# 2 | RU# 3 | RU# 4 | RU# 5 | RU# 6 | ............... | RU# K-2 | RU# K-1 | RU# K |

FIG.7A

| RU# 11-1 | RU# 11-2 | RU# 11-3 | ............... | RU# 11-L |

FIG.7B

| RU# 12-1 | RU# 12-2 | ...... | RU# 11-(L-1) | RU# K-1 | RU# K |

FIG.7C

| L-STF | L-LTF | L-SIG | SIG1 | Data(MAC frame) |
| | | | | Data(MAC frame) |
| | | | | ... |
| | | | | Data(MAC frame) |

FIG.8

| Frame Control | Duration /ID | Address 1 | Address 2 | Common Info | Per User Info 1 | Per User Info 2 | ... | Per User Info n | FCS |

FIG.10

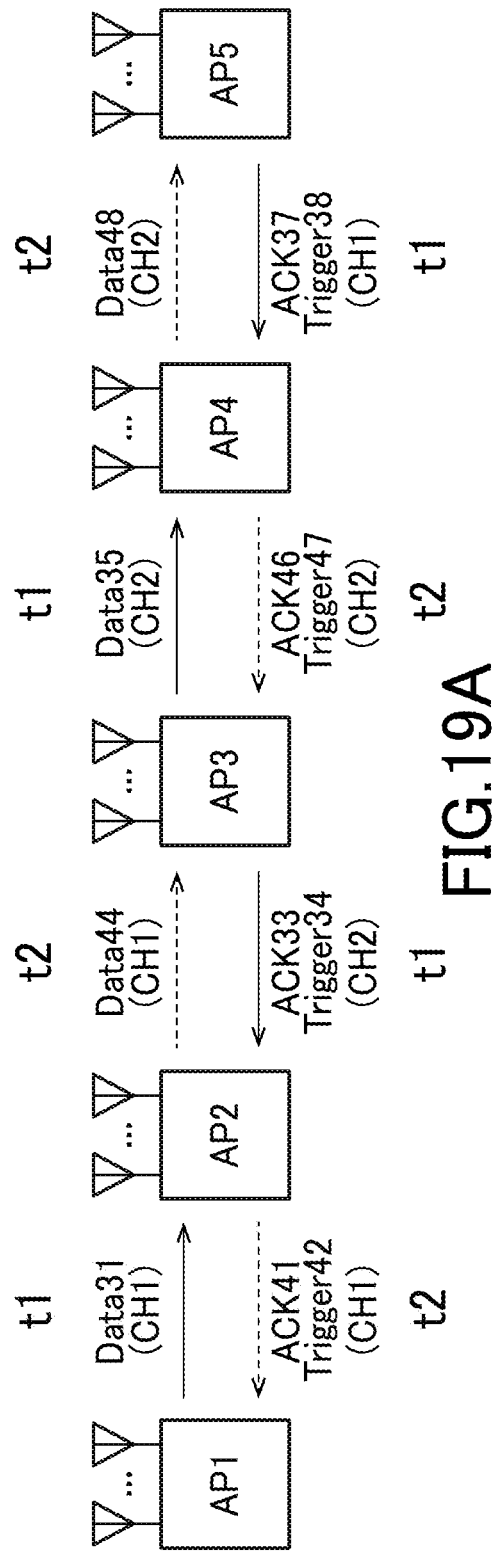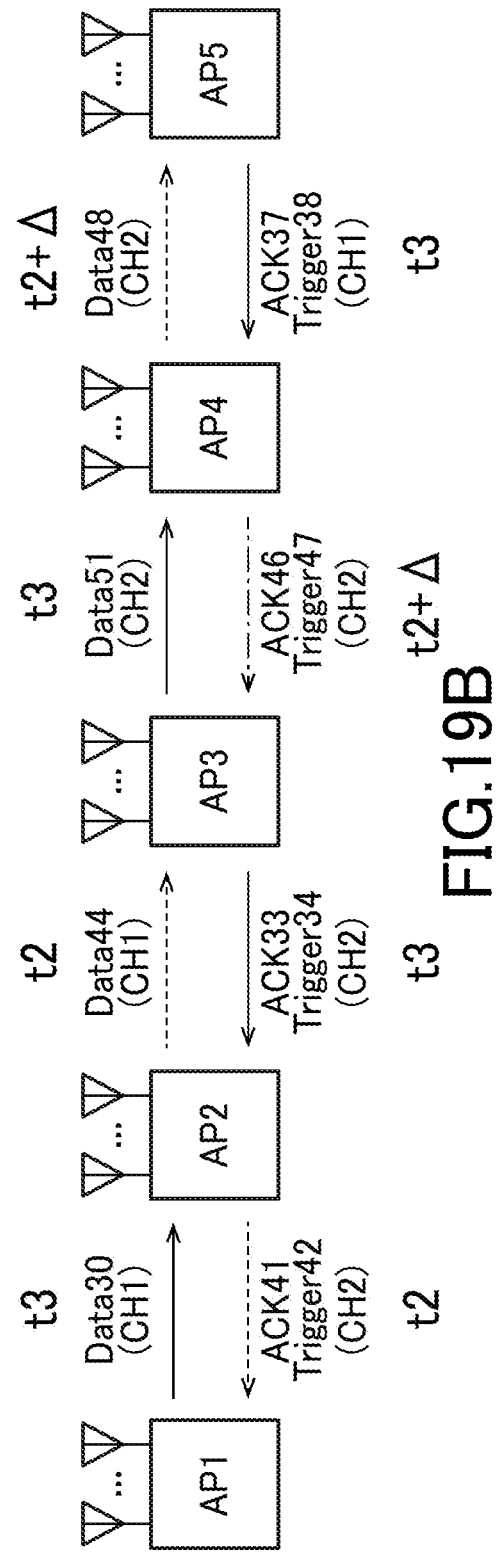

US 10,772,006 B2

WIRELESS COMMUNICATION DEVICE AND WIRELESS COMMUNICATION METHOD

CROSS REFERENCE TO RELATED APPLICATIONS

This application is based upon and claims the benefit of priority from the prior Japanese Patent Application No. 2017-056548, filed on Mar. 22, 2017, the entire contents of which are incorporated herein by reference.

FIELD

Embodiments described herein relate to a wireless communication device and a wireless communication method.

BACKGROUND

In an environment where there mixedly exist access points (relay station) connected with a wired network and access points not connected with the wired network, a mesh network has been known as a system that sequentially forwards frames received from a terminal between the access points. In the mesh network, forwarding among the access points is carried out with the time difference so that a time to be taken until the forwarding to the access point is made depends on the number of hops from the access point connected with the wired network.

In order for the access point (relay station) to simultaneously receive frames from another access point and transmit frames to a terminal, a scheme has been proposed in which both a 2.4 GHz band and a 5 GHz band are used. This scheme needs to use two bands. There is no proposal regarding how to achieve forwarding in a case where the forwarding is made via more access points.

Considering a relay network involving a plurality of relay stations, efficient forwarding is desired to reduce latency across the whole system.

BRIEF DESCRIPTION OF THE DRAWINGS

FIGS. 7A to 7C each is a diagram illustrating an arrangement of a resource unit;
FIG. 8 is a diagram showing a schematic exemplary format of a physical packet used for DL-OFDMA transmission;
FIG. 10 is a diagram showing an exemplary format of a trigger frame;
FIGS. 19A and 19B each shows exemplary sequences of the wireless communication system according to the first embodiment.

DETAILED DESCRIPTION

According to one embodiment, a wireless communication device includes: a receiver and a transmitter. The receiver is configured to receive a first frame which contains data. The transmitter is configured to transmit a second frame and a third frame by frequency multiplexing, the third frame containing the data and being addressed to a first relay station different from a sender device of the first frame. The second frame is a frame to instruct the sender device of the first frame to perform a frame transmission.

The entire contents of IEEE Std 802.11™-2012 and IEEE Std 802.11ac™-2013, known as the wireless LAN specification are herein incorporated by reference in the present specification.

Hereinafter, a description is given of embodiments of the present invention with reference to the drawings.

First Embodiment

Figure 1:
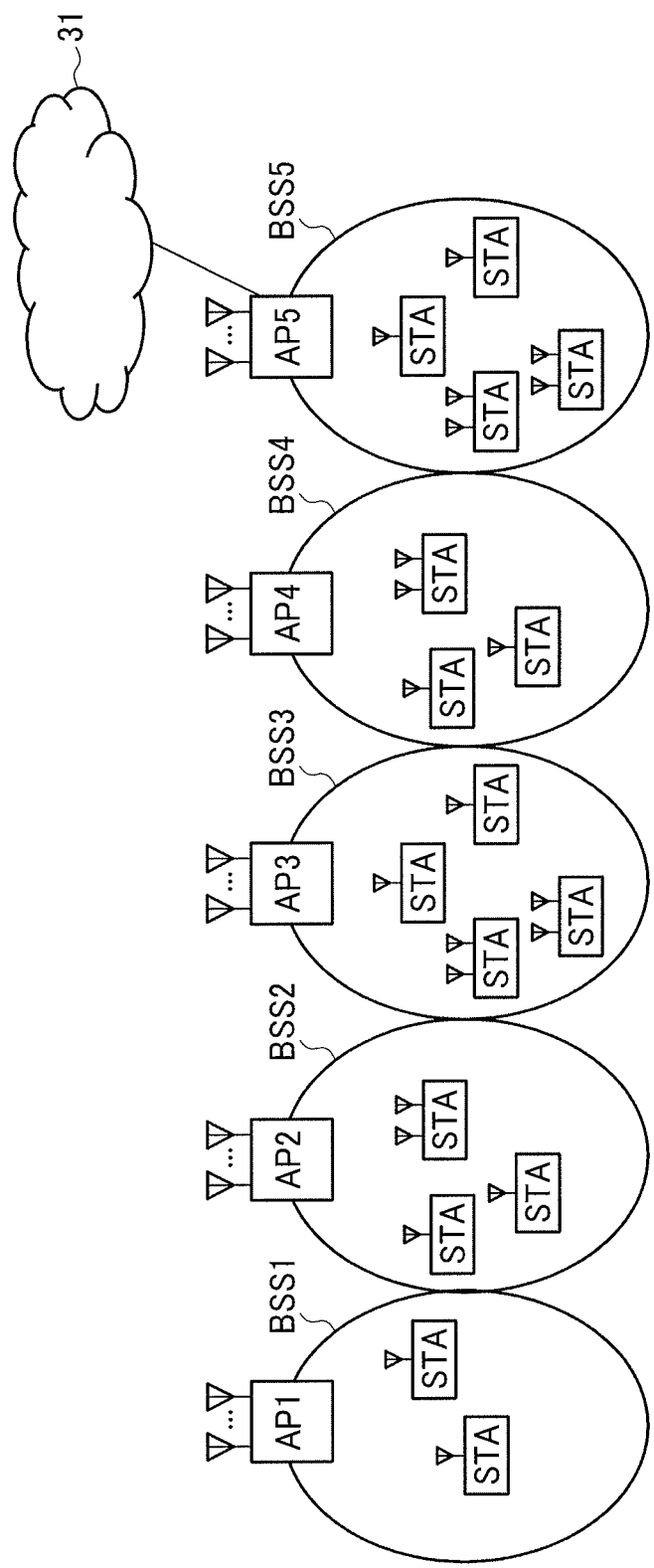
FIG. 1 is a diagram showing a wireless communication system according to a first embodiment.

FIG. 1 is a diagram showing a wireless communication system according to a first embodiment. The wireless communication system in FIG. 1 includes access points (APs) 1, 2, 3, 4, and 5 which are each a base station. The access points 1 to 5 form BSSs (BSS: Basic Service Set) 1, 2, 3, 4, and 5, respectively which are each a wireless communication group or a wireless communication network. A plurality of wireless communication terminals belongs to the BSSs 1 to 5. The wireless communication terminal may be referred to as a terminal, wireless terminal, or station (STA) in some cases. The APs 1 to 5 are each also one form of the terminal having terminal functions except for a relay function. The terminal as used in the following description may refer to an AP unless an operation specifically shows inconsistencies. Note that there may exist a control station for controlling the APs 1 to 5.

The APs 1 to 5 wirelessly communicate with the plural terminals belonging to the BSSs of the respective APs in accordance with any wireless communication scheme. As an example, the communication complying with the IEEE802.11 standard is carried out. A wireless communication device equipped in the terminal communicates with a wireless communication device equipped in the AP. The wireless communication device equipped in the AP communicates with the wireless communication device equipped in the terminal and the wireless communication device equipped in another AP existing in its communicable area. A wireless LAN based on IEEE802.11 standard is assumed for the wireless communication system in the embodiment without limitation.

The terminals belonging to the BSSs 1 to 5 can communicate with the APs 1 to 5 forming the BSSs 1 to 5, respectively. Each AP can communicate with other APs so long as they belong to a communicable area of itself. In the example in FIG. 1, the AP 1 can communicate with the AP 2 adjacent thereto. The AP 2 can communicate with the AP 1 and the AP 3 respectively adjacent to the AP 2. Each AP may be communicable also with other APs which are not adjacent thereto so long as they are in a communicable area of itself. For example, the AP 1 and the AP 3 may be communicable with each other.

The AP 5 closest to a wired network 31 is connected with the wired network 31. The wired network 31 may be a LAN such as the Ethernet or a wide area network such as the Internet. In order that the terminals belonging to the APs 1 to 5 transmit data to the wired network 31, the data is necessary to be routed through the AP 5. For example, in order that the terminal belonging to the BSS 1 transmits the data to the wired network 31, it is necessary that the terminal transmits a frame containing the data to the AP 1, the AP 1 relays the frame containing the data to the AP 2, and further that the AP 2 relays the frame containing the data to the AP 3 to finally relay to the AP 5. The AP 5 is located on the most upstream side and the AP 1 is located on the most downstream side. There may exist a further another AP between the AP 5 and the wired network 31. Moreover, a further another AP may exist on the downstream side of the AP 1.

Figure 2A:
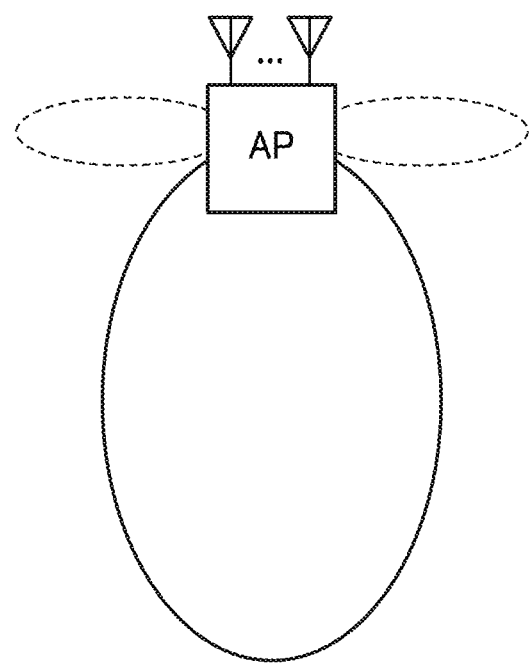
FIGS. 2A and 2B each is a diagram showing an example of a directivity control for an antenna of an access point.
Figure 2B:
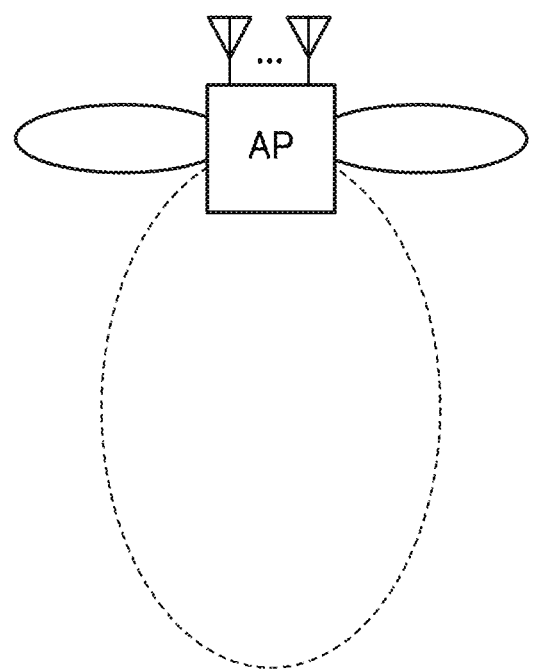

The APs 1 to 5 include one or more antennas. In the example in FIG. 1, the APs 1 to 5 respectively include two or more antennas. The number of antennas provided to the AP may be more or less than that described above. Moreover, each of the terminals includes one or more antennas. The antenna of the AP may be configured to have directivity controllable. As an example, as shown in FIG. 2A, the antennas of the respective APs may be switchable to the directivity in a direction for the terminals belonging to the BSS of the own AP and the directivity in a direction for the AP adjacent thereto. The antenna of the AP may have an antennas with directivity in all directions (omnidirectional directivity) in which a directivity in a particular direction is not specified. The omnidirectional directivity and the directivity shown in FIG. 2A or FIG. 2B may be switchable to each other. As a way to switch the directivity, a plurality of antennas having a plurality of directivity types may be provided to switch the antenna to be used. In addition, an antenna having a plurality of branches may be used to make the directivity to be switchable by controlling an impedance or resistance of each branch. Other method than those described here may be used to control the directivity.

The each terminal can belong to the BSS of the AP by connecting with the AP by way of an association process. The connection means a state where a wireless link is established, and a parameter required for the communication is completely exchanged by way of the association process with the AP so as to establish the wireless link. The terminal establishing the wireless link has an Association ID (AID) allocated from the AP. The AID is an identifier given in the association process which is performed between the terminal and the AP in order that the terminal belongs to the BSS of the AP. More specifically, in a case where the AP authorizes the terminal that transmitted a connection request (Association Request) frame to connect therewith, it allocates a number which is generated locally in the relevant network to the terminal. The number is what is called the AID, and a certain number in a specified range other than 0 is allocated. The AID is allocated so as to be unique in that network (BSS). The AP transmits a connection response (Association Response) frame containing the allocated AID to the terminal which is to be authorized to connect therewith. The terminal grasps its AID by reading out the AID from the connection response frame. The terminal receives the connection response frame for the connection authorization from the AP to be able to belong to the BSS formed by the AP and thereafter communicate with access point. Such a process for connection between the AP and the terminal is called an association process. The AP may perform an Authentication process before the association process with the terminal. The AP can identify the terminal connected with itself by means of the AID or a MAC address.

Figure 3:
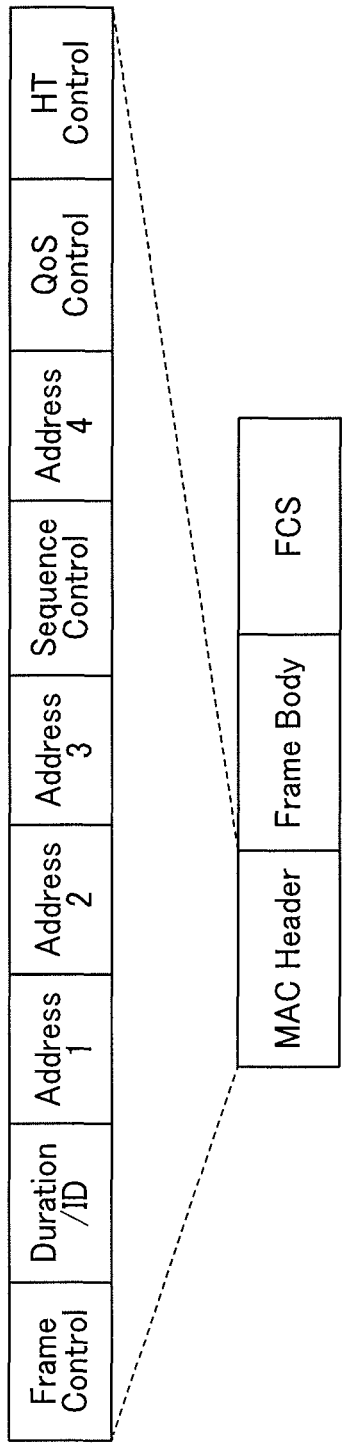
FIG. 3 is a diagram showing an exemplary basic format of a MAC frame.

FIG. 3 illustrates the basic exemplary format of the MAC frame. The data frame, the management frame, and the control frame in accordance with this embodiment are based on a frame format as shown in FIG. 3. This frame format includes the fields of MAC header, Frame body, and FCS. The MAC header includes the fields of Frame Control, Duration/ID, Address 1, Address 2, Address 3, Sequence Control, Address 4, QoS Control, and HT (High Throughput) Control.

These fields do not need to always exist and there may be cases where some of these fields do not exist. For example, there may be a case where the Address 3 or Address 4, or both of them does not exist. Also, there may be other cases where both or either one of the QoS Control field and the HT Control field does not exist. Also, there may be still other cases where the frame body field does not exist. Also, any field or fields that are not illustrated in FIG. 4 may exist. The HT control field can be extended to a VHT (Very High Throughput) control field in IEEE 802.11ac or an HE (High Efficient) control field in IEEE 802.11ax which is a next-generation wireless LAN standard.

The field of Address 1 indicates Receiver Address or Receiving Station Address (RA), the field of Address 2 indicates Transmitter Address or Transmitting Station Address (TA), and the field of Address 3 indicates either BSSID (Basic Service Set IDentifier) (which may be the wildcard BSSID whose bits are all set to 1 to cover all of the BSSIDs depending on the cases) which is the identifier of the BSS, or TA, depending on the purpose of the frame. The field of Address 4 is used for communication between AP. The field of Address 4 may not exist in some cases.

Two fields of Type and Subtype (Subtype) or the like are set in the Frame Control field. The rough classification as to whether it is the data frame, the management frame, or the control frame is made by the Type field, and more specific types, for example, fine discrimination among the roughly classified frames is made by the Subtype field. For example, fine discrimination as to whether it is a RTS (Request to Send) frame, a CTS (Clear to Send) frame, an ACK frame, or a BA (Block Ack) frame within the control frame is made by the Subtype field.

The Duration/ID field describes the medium reserve time, and it is determined that the medium is virtually in the busy state from the end of the physical packet including this MAC frame to the medium reserve time when a MAC frame addressed to another terminal is received. The scheme of this type to virtually determine that the medium is in the busy state, or the period during which the medium is virtually regarded as being in the busy state, is, as described above, called NAV (Network Allocation Vector).

The QoS control field is used to carry out QoS control to carry out transmission with the priorities of the frames taken into account. The QoS control field includes a TID field (16 types from 0 to 15) in which an identifier is set for data traffic, and an Ack policy field in which an acknowledgement scheme is set. The confirmation of the TID field enables to identify the traffic type of the data. Moreover, the confirmation of the Ack policy field enables to determine whether the QoS Data frame is a normal Ack policy or a block Ack policy or whether the data frame has been transmitted as No Ack policy.

The HT control filed is a filed introduced in IEEE 802.11n. The HT (High Throughput) control field is present when the Order field is set to 1 for QoS data frame or a management frame. The HT control field can be extended to a VHT (Very High Throughput) control field in IEEE 802.11ac or an HE (High Efficient) control field in IEEE 802.11ax which is a next-generation wireless LAN standard and can provide notifications corresponding to the functions of 802.11n, 802.11ac, or 802.11ax.

Frame check sequence (FCS) information is set in the FCS field as a checksum code for use in error detection of the frame on the reception side. As an example of the FCS information, CRC (Cyclic Redundancy Code) may be mentioned.

The content of the addresses set in the fields of Address 1, Address 2, Address 3, and Address 4 varies depending on whether the frame is transmitted to the AP or transmitted from the AP, whether the frame is an MSDU (MAC Service Data Unit) or an A-MSDU (A(Aggregated)-MSDU), and so forth.

Here, the MSDU denotes data (frame body part) in the MAC frame that is an MPDU (Medium access control (MAC) Protocol Data Unit). The A-MSDU denotes a configuration in which the MSDUs that are a plurality of data payloads are conjunct in the frame body of one MPDU. The expression, such as MSDU, A-MSDU, and MPDU, is a way of calling in the IEEE 802.11 standard.

Figures 4, 5:
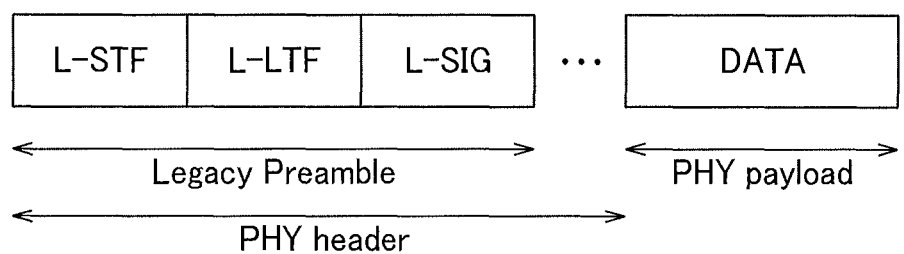
FIG. 4 is a diagram showing an example of a table of a setting rule for Address 1 to Address 4 fields.
FIG. 5 is a diagram showing an exemplary structure of a physical packet.

FIG. 5 shows an example of a table showing the content set in the fields of Address 1, Address 2, Address 3, and Address 4. The table is extracted from IEEE 802.11 specifications. The number and definition of the Address fields defined in the frame header may vary according to the type or standard of the protocol used, and in that case, the content of the addresses set in the Address fields do not have to follow the table.

Figure 6:
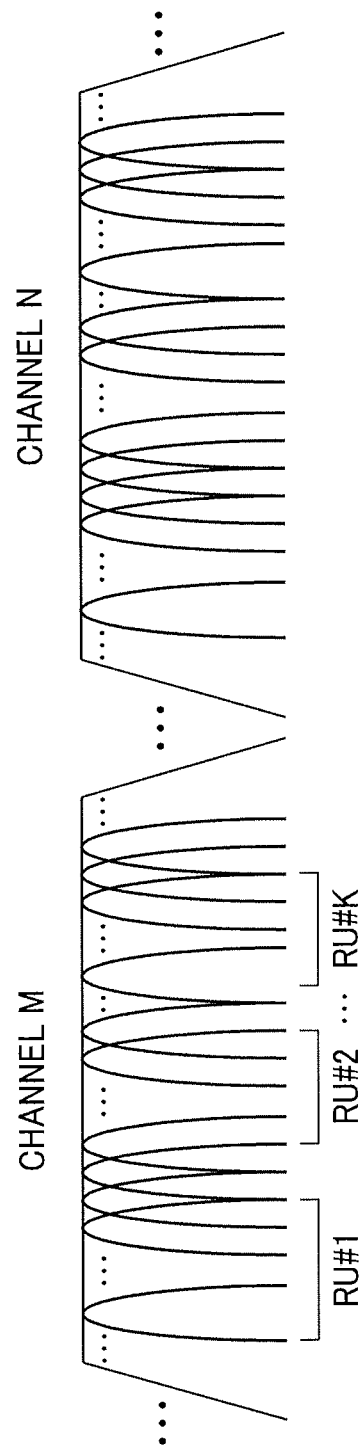
FIG. 6 is a diagram illustrating resource unit allocation.

A "To DS" bit and a "From DS" bit in the table of FIG. 6 correspond to bits set in subfields of To DS and From DS of the Frame Control field. A bit "1" is set in "To DS" when the frame is to be transmitted to the base station, and a bit "0" is set in other cases. A bit "1" is set in "From DS" when the frame is to be transmitted from the base station, and "0" is set in other cases.

A setting example of an uppermost line ("To DS"=0, "From DS"=0) indicates a frame directly transmitted from a terminal to another terminal in the same BSS. In this case, the address (MAC address) of the terminal (the other terminal) that is the direct destination of the transmitted frame is set for the receiver address (Receiver Address; RA) in the Address 1 field. Other than the address of the terminal (unicast address), a broadcast address or a multicast address may be set for the RA (the same applies hereinafter). In the Address 2 field, an SA (Source Address) is set for the transmitter address (Transmitter Address; TA). The SA is an address of the terminal that is the first transmitter at the start of forwarding of the frame. Here, the SA is the address of the terminal. The BSSID (Basic Service Set IDentifier) (may be wildcard BSSID for putting "1" into all bits and targeting all BSSIDs) that is the identifier of the BSS is set in the Address 3 field. The Address 4 field is not used.

A setting example of a second line ("To DS"=0, "From DS"=1) indicates a frame transmitted from a base station (BSS) to a terminal belonging to the base station (BSS). In this case, the address (MAC address) of the terminal of the receiver is set for the RA in the Address 1 field. In the Address 2 field, the BSSID of the base station that is the transmitter is set for the TA. The SA (Source Address) or the BSSID is set in the Address 3 field according to whether the frame includes the MSDU or the A-MSDU. The Address 4 field is not used.

A setting example of a third line ("To DS"=1, "From DS"=0) indicates a frame transmitted from a terminal belonging to a base station (BSS) to the base station. In this case, the BSSID of the base station that is the receiver is set for the RA in the Address 1 field. In the Address 2 field, the SA, that is, the address (MAC address) of the terminal, is set for the TA. In the Address 3 field, a DA (Destination Address) or the BSSID is set according to whether the frame includes the MSDU or the A-MSDU. The DA is the address of the terminal at the destination where the frame is ultimately forwarded. The Address 4 field is not used.

A setting example of a fourth line ("To DS"=1, "From DS"=1) denotes a frame of communication between base stations (BSSs). In this case, the BSSID of the base station that is the receiver is set for the RA in the Address 1 field. In the Address 2 field, the address (MAC address) of the base station that is the transmitter is set for the TA.
In the Address 3 field, the DA (Destination Address) or the BSSID is set according to whether the frame includes the MSDU or the A-MSDU. The SA or the BSSID is set in the Address 4 field according to whether the frame includes the MSDU or the A-MSDU.

The embodiment shows an example in which the terminal belonging to the BSS 1 of the access point 1 transmits the frame to be forwarded via the access points 1, 2, 3 and 4 to the access point 5, where in forwarding from each access point, each of the Address 1 to Address 4 fields of the MAC header may be rewritten into an adequate address (or BSSID) in accordance with the above described rule.

Here, the frame transmitted by the AP and the frame transmitted by the terminal each actually have a physical header (PHY header) added to a head of the frame, and a physical packet including the physical header and the frame is transmitted. The physical packet may be referred to as the physical frame.

FIG. 5 shows an exemplary format of the physical packet. The physical packet includes the physical header and a PHY payload. The physical header contains a Legacy Preamble part and a Preamble part depending on various standards such as 11n, 11ac, or 11ax. The PHY payload is a data part and contains a frame having been subjected to a modulation process. The Legacy Preamble has the same structure as the physical header defined by the IEEE802.11a and contains fields of an L-STF, an L-LTF, and an L-SIG. The L-STF or the L-LTF represents a known bit pattern. These are used for a device on the reception side to carry out reception gain adjustment, timing synchronization, channel estimation and the like. The L-SIG includes information for calculating by the device on the reception side a time required for transmitting the subsequent Preamble part and PHY payload.

Here, each of the APs 1 to 5 in the embodiment can implement an OFDMA (Orthogonal Frequency Division Multiple Access) with the terminals belonging to its own BSS and the other AP than itself. Here, in the OFDMA scheme, the frequency components are defined as resource units (a resource unit may refer to a sub-channel, a resource block or a frequency block etc.) each including one or a plurality of subcarriers, and the resource units are allocated to the terminals (at least one of which may refer to AP), and transmissions to the plurality of terminals or receptions from the plurality of terminals are simultaneously performed. An uplink OFDMA (where transmissions are simultaneously performed from a plurality of terminals (at least one of which may refer an AP) to a particular AP) is described as UL-OFDMA, and a downlink OFDMA (where transmissions are simultaneously performed from one AP to a plurality of terminals (at least one of which may refer an AP)) is described as DL-OFDM.

The resource unit (RU) is a frequency component to be a smallest unit of a resource for performing communication. FIG. 6 illustrates the RU (RU#1, RU#2 . . . RU#K) arranged within a continuous frequency domain of one channel (which is described here as the channel M). A plurality of subcarriers orthogonal to each other are arranged in the channel M, and a plurality of RU including one or a plurality of continuous subcarriers are defined within the channel M. Although one or more subcarriers (guard subcarriers) may be arranged between the RU, presence of the guard subcarrier is not essential. A number for identification of the subcarrier may be assigned to each carrier in the channel. The bandwidth of one channel may be for example, though not limited to these, 20 MHz, 40 MHz, 80 MHz, and 160 MHz. One channel may be constituted by combining a plurality of channels of 20 MHz. The number of subcarriers in the channel or the number of RU may vary in accordance with the bandwidth. An OFDMA communication is realized by different RU being simultaneously used by different terminals (at least one of which may refer an AP).

The bandwidth of the RU (or the number of subcarriers) may be common in the respective RUs or the bandwidth (or the number of subcarriers) may be different for each RU. FIG. 7A to FIG. 7C each schematically show an exemplary arrangement pattern of the RUs in one channel. A landscape orientation along a paper plane corresponds to a frequency domain direction. Each pattern is given a pattern identifier and any of the patterns may be selected by the AP. The pattern shown here is an example and other various patterns may be used.

FIG. 7A illustrates an example where a plurality of RUs (RU#1, RU#2 . . . RU#K) having the same bandwidth are arranged FIG. 7B illustrates another example where a plurality of RUs (RU#11-1, RU#11-2 . . . RU#11-L) having a larger bandwidth than that of FIG. 7A are arranged. FIG. 7C illustrates a still another example where RUs with three types of bandwidths are arranged. The RUs (RU#12-1, RU#12-2) have the largest bandwidth, the RU#11-(L−1) has the bandwidth identical to that of FIG. 7B. The RUs (RU#K−1, RU#K) have the bandwidth identical to that of FIG. 7A.

Here, the number of RUs used for OFDMA by each terminal (which may refer an AP) is not limited to a particular value and one or a plurality of RUs may be used. When a terminal uses a plurality of RUs, a plurality of RUs that are continuous in terms of frequency may be bonded to be used as a single RU. A plurality of RUs that are located at positions away from each other may be used. The RU#11-1 of FIG. 7B may be considered as an example of a bonded RU of the RU#1 and the RU#2 of FIG. 7A.

It is assumed here that subcarriers within one RU are continuous in the frequency domain. However, RU may be defined with use of a plurality of subcarriers that are arranged in a non-continuous manner. The channels used in OFDMA communication are not limited to one single channel but RU may be reserved in another channel (see the channel N in FIG. 6, for example) arranged at a location away in the frequency domain from the channel M as the case of the channel M and thus the RU in both the channel M and the channel N may be used. The same or different modes of arranging the RU may be used for the channel M and the channel N. The bandwidth of the channel N is by way of example 20 MHz, 40 MHz, 80 MHz, 160 MHz, etc. as described above but not limited to them. It is also possible to use three or more channels. It is considered here that the combining of the channel M and the channel N may be regarded as one single channel.

The channel-based OFDMA is also possible in addition to the above-described RU-based OFDMA. OFDMA of this case may in particular be called MU-MC (Multi-User Multi-Channel). In MU-MC, a base station assigns a plurality of channels (one channel width is, for example, 20 MHz, etc.) to a plurality of terminals (including a case of APs), and the plurality of channels are simultaneously used to carry out simultaneous transmissions to the plurality of terminals or simultaneous receptions from the plurality of terminals. The OFDMA which will be described below means the RU-based OFDMA: however, an embodiment of channel-based OFDMA can also be implemented with appropriate replacement of terms and phrases in the following explanations such as reading the "RU" as the "channel".

FIG. 8 shows an exemplary structure of the physical packet in a case where the AP transmits the frame to a plurality of terminals (at least one of which may refer to an AP) by way of the DL-OFDMA. The L-STF, L-LTF, and L-SIG fields are transmitted at a channel width of 20 MHz, as an example, and any frame for each terminal is set to the same value (same symbol). A SIG 1 field is set to information notified to a plurality of terminals. As an example, the SIG 1 field may correspond to an HE-SIG-A field or HE-SIG-B field in the IEEE802.11ax standard, or both of these. For example, the SIG 1 field is set to information specifying a plurality of terminals as transmission destinations by way of the DL-OFDMA and information specifying a frequency resource (RU or channel or both) to be used for the reception by each terminal. For example, the information of the terminal identifier associated with an RU number (identifier) is set. As another example, the SIG 1 field may be provided with subfields each associated with a particular RU and each subfield may be set to the terminal identifier. In this case, the RU to be used can be specified to the terminal without specifying the RU number. The terminal identifier may be the Association ID (AID), a part of the AID (Partial AID), or other identifier such as the MAC address. The SIG 1 field is also transmitted at a channel width of 20 MHz, as an example. Any of the terminals can decode the SIG 1 field. Therefore, each terminal receiving the signal from the AP can grasp, by decoding the SIG 1 field, whether itself is specified and the RU to be decoded by itself. Each terminal decodes the signal of the RU specified to itself to receive the frame in a payload. Note that another field such as the SIG2 field or a Preamble field for channel estimation field may be arranged between the SIG 1 field and each data field (MAC frame) in a unit of RU (i.e., previous to each data field). The SIG 2 field may be set to information individually notified to the terminal which is to receive the RU.

Figure 9:
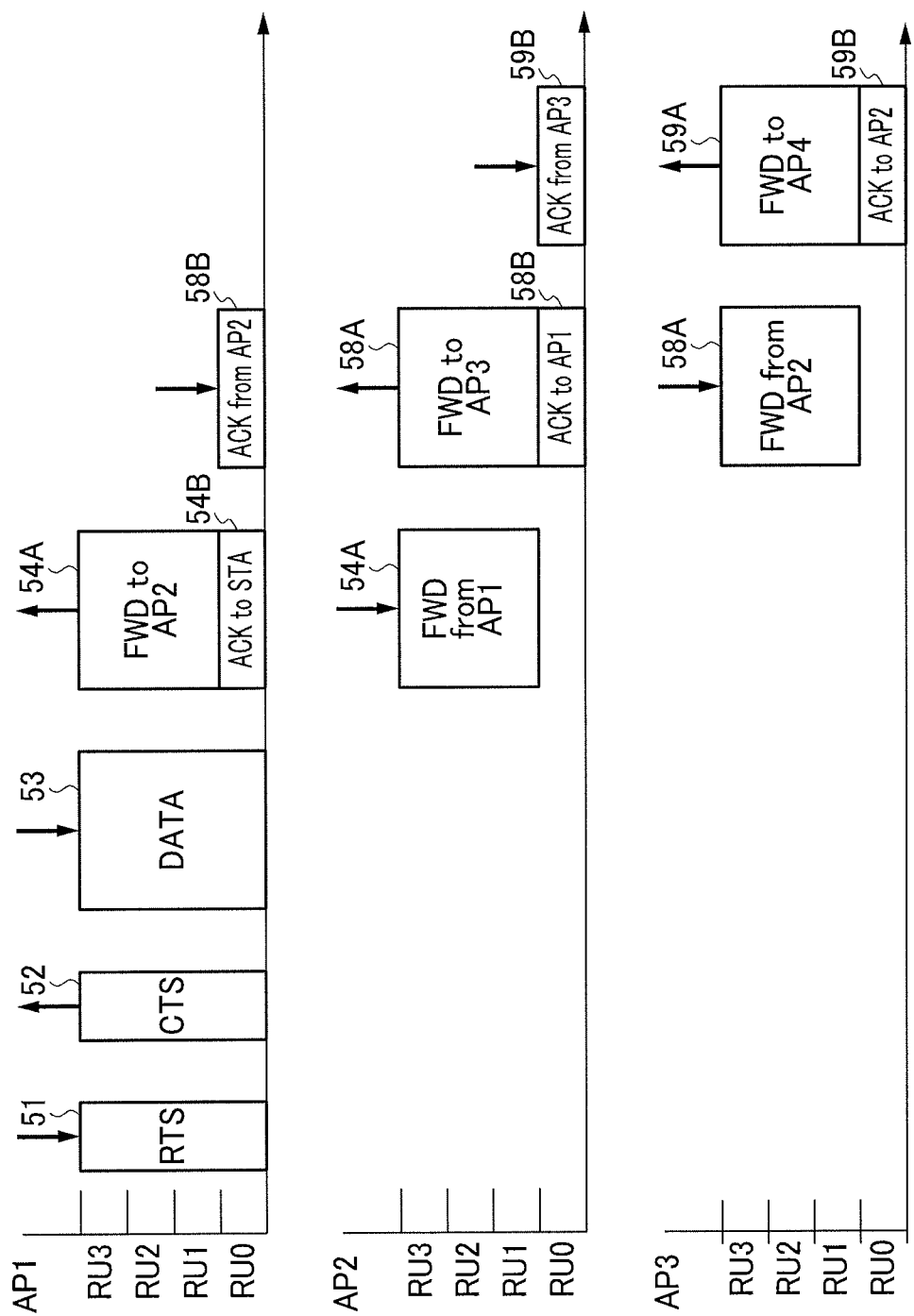
FIG. 9 is a diagram showing an exemplary sequence of a wireless communication system according to a related art.

Hereinafter, a description is given of a technical challenge the embodiment addresses using a system configuration in FIG. 1. FIG. 9 shows a diagram showing an exemplary operation sequence according to a related art. Here, assume a case where a channel of 20 MHz bandwidth including the RU 0 to the RU 3 having the same bandwidth is used. In practice, more RUs may be arranged in the channel of 20 MHz bandwidth or the RUs may not have the same bandwidth. FIG. 9 shows only the AP 1 to the AP 3 with the AP 4 and AP 5 being omitted. Note upward arrows represent the transmissions and downward arrows represent the receptions.

The AP 1 receives an RTS frame 51 from a certain terminal in the BSS 1. The RTS frame 51 is a frame requesting transmission authorization from the AP 1. An RA of the RTS frame 51 is the MAC address (BSSID) of the AP 1, and a TA is the MAC address of the terminal. The terminal acquires an access right to the wireless medium in accordance with CSMA/CA before transmitting the RTS frame 51.

Once the AP 1 receives the RTS frame 51, it transmits a CTS frame 52 after elapse of an SIFS (Short Interframe Space) from the completion of the receiving. An RA of the CTS frame 52 is the MAC address (TA of the RTS frame 51) of a sender terminal of the RTS frame 51. The TA may not exist in the CTS frame 52.

The CTS frame 52 transmitted by the AP 1 is received by the sender terminal of the RTS frame 51 and another terminal in the BSS 1. Once the sender terminal of the RTS frame 51 receives the CTS frame 52, it determines that the transmission authorization is obtained and transmits, after elapse of the SIFS from that time, a data frame 53.

Once the AP 1 receives the data frame 53, it transmits, after elapse of the SIFS from that time, by way of the OFDMA an acknowledgement response frame 54B (ACK frame in the figure) with respect to the relevant terminal and a data frame 54A with respect to the AP 2. A frame body field of the data frame 54A is set to data extracted from a frame body field of the data frame 53. This allows the data frame 53 to be relayed (forwarded) as the data frame 54A. The address field and the like of the MAC header are adequately rewritten when they are forwarded (see FIG. 5). An RA of the data frame 54A is the MAC address (BSSID) of the AP 2. In a case where the end of the data frame 54A and the end of the ACK frame 54B do not align with each other, padding data may be added to the shorter frame.

In the example in the figure, the ACK frame 54B is transmitted by use of the RU 0 and the data frame 54A is transmitted by use of the RU 1 to the RU 3. The RU 1 to the RU 3 may be subjected to bonding to transmit one data frame using a band after bonding, or the data frame may be transmitted for each of the RU 1 to the RU 3. As described with reference to FIG. 8, the data frame 54A and the ACK frame 54B are transmitted as one packet containing these frames. Here, although the AP 1 forwards only the data received from the sender terminal of the above data frame 53, if other data to be forwarded exists in an inner buffer of the AP 1, this data also may be simultaneously transmitted (the same holds for the following). For example, the data frame 54A may be transmitted by use of the RU 2 and the RU 3, and the data frame including the above other data may be transmitted by use of the RU 1.

The AP 2 and the sender terminal of the data frame 53 receive the packet transmitted by the AP 1. The terminal receiving the packet identifies the RU 0 for itself from the physical header of the packet and decodes the RU 0 to obtain the ACK frame 54B. The AP 2 identifies the RU 1 to the RU 3 for itself from the same physical header and decodes the RU 1 to the RU 3 to obtain the data frame 54A. The AP 2 also receives but does not decode the ACK frame 54B contained in the packet, and therefore, is depicted as if the AP 2 does not receive the frame by use of the RU 0 in the figure.

The AP 2 transmits an ACK frame 58B with respect to the AP 1 and a data frame 58A with respect to the AP 3 by way of the OFDMA after elapse of the SIFS from the completion of receiving the packet. A frame body field of the data frame 58A is set to data extracted from the frame body field of the data frame 54A. This allows the data frame 54A to be relayed (forwarded) as the data frame 58A. At this time, the address field and the like of the MAC header are adequately rewritten (see FIG. 5). An RA of the data frame 58A is the MAC address (BSSID) of the AP 3. In the example, the ACK frame 58B is transmitted by use of the RU 0 and the data frame 58A is transmitted by use of the RU 1 to the RU 3. This allows the packet containing the data frame 58A and the ACK frame 58B to be transmitted.

When the AP 2 simultaneously receives other data frame than the data frame 54 from the AP 1, it may return an ACK frame in response to the relevant other data frame at the same time as the returning of the ACK frame 58B (the same holds for the following). At this time, the respective ACK frames may be returned by use of the RUs different from each other, or one acknowledgement response frame including together the acknowledgement responses to the data frame 54 and other data frame may be transmitted. As an example of such an acknowledgement response frame, a Multi-Station BA (hereinafter, referred to as Multi-STA BA) frame investigated in the IEEE802.11ax may be used, or a frame newly defined differently from this may be used.

The AP 3 and the AP 1 receive the packet transmitted by the AP 2. The AP 1 identifies the RU 0 for itself from the physical header of the packet and decodes the RU 0 to obtain the ACK frame 58B. The AP 3 identifies the RU 1 to the RU 3 for itself from the same physical header and decodes the RU 1 to the RU 3 to obtain the data frame 58A. The AP 3 also receives but does not decode the ACK frame 58B contained in the packet, and therefore, is depicted as if the AP 3 does not receive the frame by use of the RU 0 in the figure.

The AP 3 transmits an ACK frame 59B with respect to the AP 2 and a data frame 59A with respect to the AP 4 by way of the OFDMA after elapse of the SIFS from the completion of receiving the packet. A frame body field of the data frame 59A is set to data extracted from the frame body field of the data frame 58A. This allows the data frame 58A to be relayed (forwarded) as the data frame 59A. An RA of the data frame 59A is the MAC address (BSSID) of the AP 4. In the example, the ACK frame 59B is transmitted by use of the RU 0 and the data frame 59A is transmitted by use of the RU 1 to the RU 3. Subsequently, the date is similarly forwarded by way of the relay between APs and finally output through the AP 5 to the wired network 31.

In the above sequence in FIG. 9 according to the related art, the system is efficiently used from a viewpoint that the transmission of the data frame (e.g., transmission of the data frame 54A) and the transmission of the ACK frame (e.g., transmission of the ACK frame 54B) are simultaneously performed. However, after elapse of the SIFS from when the AP 1 receives the ACK frame 58B from the AP 2, if the AP 1 is going to transmit the next data frame to the AP 2, the AP 2 receives at this timing the ACK frame 59B from the AP 3. For this reason, if the AP 1 transmits the next data frame, frame collision is likely to occur at the AP 2. Therefore, the AP 1 cannot transmit the next data frame in fact, which may lead to latency across the whole system. The description here relates to the AP 1, but the same also occurs in the other APs. The embodiment solves this disadvantage to reduce the latency across the whole system. For example, a scheme is provided that the AP 1 can transmit the next data frame to the AP 2 after elapse of the SIFS from receiving the ACK frame 58B.

The embodiment is characterized in that the AP transmits a trigger frame at the same time as when it transmits the data frame or the acknowledgement response frame (ACK frame or the like). The trigger frame is a frame that specifies one or more terminals (each of which may refer to an AP) as transmission destinations and controls the relevant specified terminal (AP) in terms of a timing to transmit the next frame or the frequency resource (RU or channel or both) to be used for the relevant next frame transmission. The trigger frame includes information identifying the specified terminal and information specifying parameter information (e.g., the RU or channel used for the transmission) notified to the relevant specified terminal as an example. In the embodiment, a description is given assuming mainly that the trigger frame specifies the AP. The AP receiving the trigger frame transmits, in a case where the AP itself is specified in the trigger frame, the frame in accordance with the parameter information specified in the trigger frame after elapse of a predefined time period (the SIFS is assumed in the embodiment without limitation) from the completion of the receiving. The embodiment shows a scheme that the trigger frame having a role like this is transmitted by way of the OFDMA at the same time as the ACK frame or the data frame such that the frequency resource is efficiently used to reduce the latency across the whole system.

FIG. 10 shows an exemplary format of the trigger frame. The format of the trigger frame shown here is an example, and another format may be used so long as the terminal as a transmission destination (which may be refer to an AP, and an AP is assumed in the following description) can be specified and the parameter information required for the AP can be notified.

The format in FIG. 10 has a format of a general MAC frame as a base shown in FIG. 3. More concretely, the format in FIG. 10 includes a Frame Control field, a Duration/ID field, an Address 1 field, an Address 2 field, a common information field (Common Info field), one or more plural Per User Info fields, and a FCS field. A Type and Subtype of the Frame Control field are used to specify a value identifying the trigger frame. The Type is a value indicating "control" as an example, and the Subtype is a value newly defined corresponding to the trigger frame. However, the Type may be a value indicating "management" or "data". Other method than those described here may be used for identifying the trigger frame.

The RA is a broadcast address, a multicast address or a unicast address. In a case of specifying only one AP in the trigger frame, an address of the transmission destination AP (which is MAC address or BSSID, and the same holds for the following) is used as the RA. If the trigger frame is transmitted to one terminal which is not an AP, a MAC address of the relevant terminal may be used as the RA. The TA is the MAC address (BSSID) of the sender AP of the trigger frame.

The Common Info field is set to parameter information notified in common to one or more terminals which are specified in the trigger frame. As the parameter information, for example, a frame length or packet length to be transmitted in response to the trigger frame may be set. Information specifying a transmission timing when to respond to the trigger frame may be explicitly set. Moreover, information specifying an operation to request from the AP receiving the trigger frame may be set. For example, the request may be a request to report a volume of data in a state of waiting transmission (data size) accumulated on the AP. Additionally, for example, information specifying a format of the Per User field or information indicating the number of the Per User Info fields may be set.

The Per User Info field is set to information specifying one or more APs to be triggered (AID, MAC address or the like), and additionally, parameter information notified to the AP. Examples of the parameter information include information specifying the frequency resource (RU or channel or both) used for the transmission in response to the trigger frame, an MCS (Modulation and Coding Scheme) index corresponding to a transmission rate applied to the transmission, transmit power information, and the like. Information specifying the classification of the frame to be transmitted (data frame, ACK frame, trigger frame, or the like) may be specified. Note that in a case where the RA of the trigger frame is a unicast address and the number of the specified AP is one, setting the Per User Info field to the information specifying the relevant AP may be omitted.

The examples shown here are merely illustrated exemplarily, and the information shown to be set in the Common Info field may be set in the Per User Info field, and vice versa. The format is not limited to those described above so long as the necessary information can be notified to the transmission destination AP of the trigger frame.

Hereinafter, a description is given of an exemplary operation sequence using the above described trigger frame according to the embodiment.

(First Example of Operation Sequence According to Embodiment)

Figure 11:
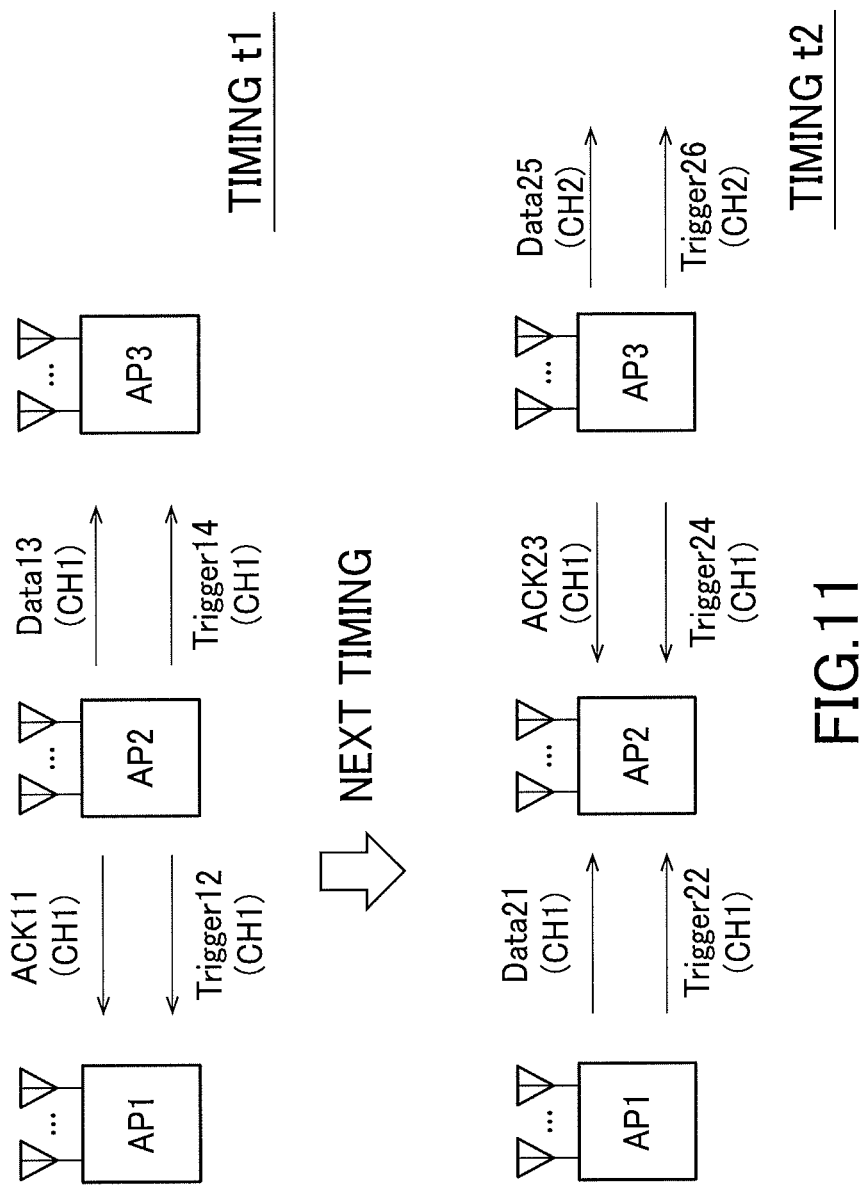
FIG. 11 is a diagram showing an exemplary sequence of the wireless communication system according to the first embodiment.
Figure 12:
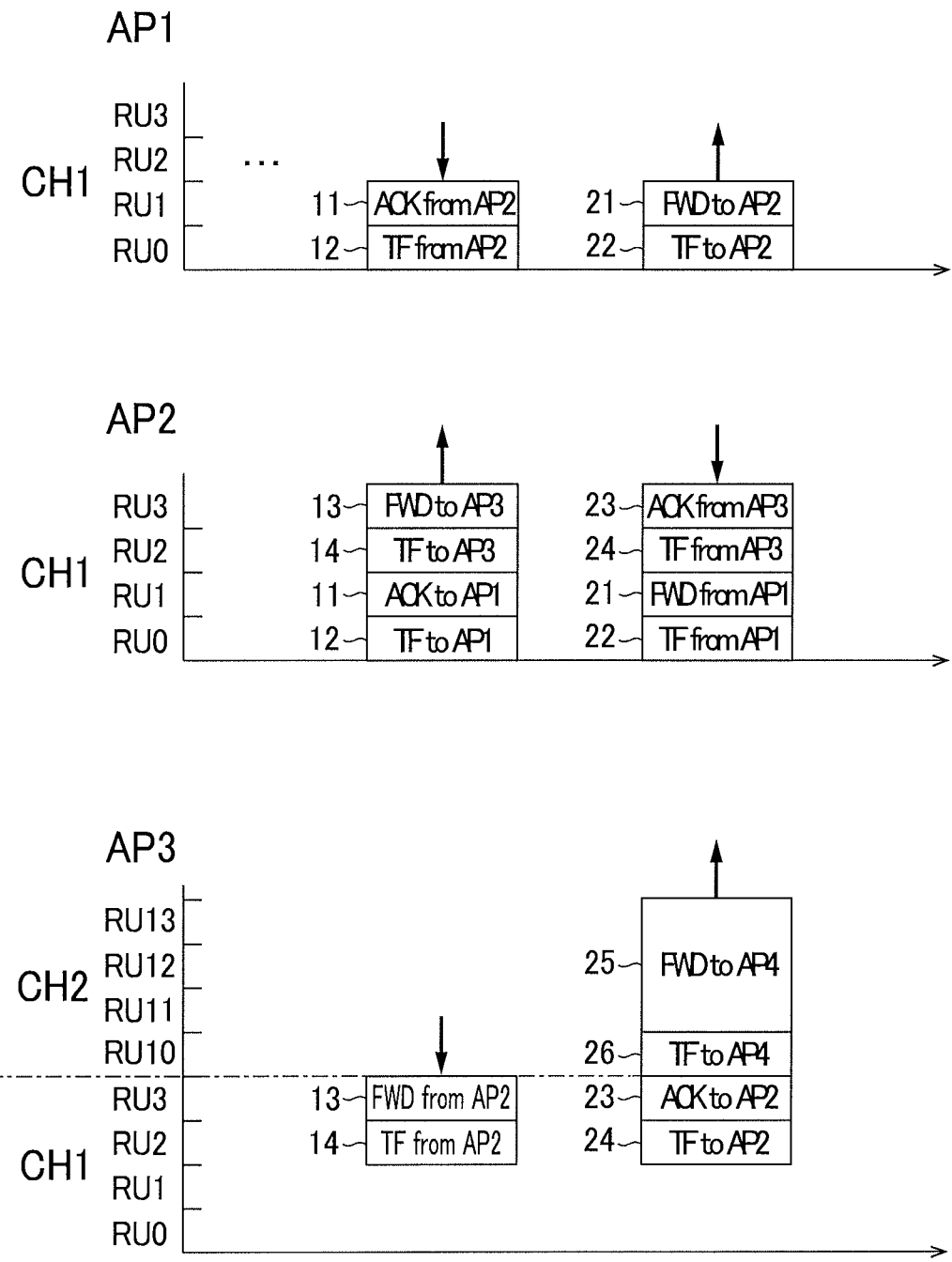
FIG. 12 is a diagram showing an exemplary sequence of the wireless communication system according to the first embodiment.

FIG. 11 and FIG. 12 are each a diagram showing a first example of an operation sequence according to the embodiment. The AP 1 to the AP 3 only are shown for the sake of illustration. Each AP communicates with not only the adjacent APs but also the terminals belonging to the BSS of its own (its BSS), but these terminals and communication with those are omitted. In the sequence described in the related art, only one channel is used, whereas in the embodiment two channels (channel CH1 and CH2) are used. Assume a case where the channel CH1 is used among the AP 1, AP 2, and AP 3, and the channel CH2 are used among the AP 3, AP 4, and AP 5. For the purpose of illustration, the channel CH1 includes four RUs (RU 1, RU 2, RU 3, and RU 4) and the channel CH2 includes four RUs (RU 10, RU 11, RU 12, and RU 13) without limitation.

The AP 2 has received previously at a certain timing the data frame from the AP 1 using the channel CH1 and succeeded in a CRC check. In other words, the AP 2 has previously received from the AP 1 the data to be forwarded. As shown in the upper figure of FIG. 11, the AP 2 performs OFDMA transmission using the channel CH1 at a timing t1 after elapse of a certain time period (which is the SIFS in the embodiment). Concretely, the AP 2 transmits an ACK frame 11 with respect to AP 1, a trigger frame 12 with respect to the AP 1, a data frame 13 with respect to the AP 3, and a trigger frame 14 with respect to the AP 3 by use of the RU 1, RU 0, RU 2, and RU 3, respectively (see FIG. 12). Assume that the AP 1 and the AP 3 do not perform the transmission to any AP or terminal at the timing t1.

An RA of the trigger frame 12 specifying the AP 1 is an address of the AP 1 (or may be a broadcast address or the like), and, as an example, one of two Per User Info field is set information on to the AP 1 (which is, for example, the RU or channel used for the transmission, the MCS or the like, and the same holds of the following) and the other Per User Info field is set to information on the AP 2. Similarly, an RA of the trigger frame 14 specifying the AP 3 is an address of the AP 3 (or may be a broadcast address or the like), and two Per User Info fields are set to the same content as the trigger frame 12. The common information fields and the like of both trigger frames 12 and 14 may also be set to the same content.

Concretely, the AP 2 specifies a plurality of RUs to each of the AP 1 and AP 3. More concretely, assume that the RU 0 and the RU 1 are specified to the AP 1 and the RU 2 and the RU 3 are specified to the AP 3. In addition, assume that the AP 2 specifies, to each of the AP 1 and the AP 3, the channel CH1 as a channel used for responses to the trigger frames 12 and 14 (hereinafter, referred to as trigger response). If the channel specification is omitted, the AP 1 and the AP 3 may use a channel the same as the channel receiving the trigger frames 12 and 14.

The lower figure of FIG. 11 shows an operation at a timing t2 after elapse of the SIFS from the timing t1. In response to the trigger frame 12 from the AP 2, the AP 1 transmits a data frame 21 and a trigger frame 22 by way of the OFDMA using the channel CH1 by use of the RU 0 and RU 1, respectively. The trigger frame 22 instructs the AP 2 to perform transmission to the AP 1 at a timing t3 (not shown) after elapse of the SIFS and specifies the RU used for the transmission to the AP 1 and the like.

In response to the trigger frame 14 from the AP 2, the AP 3 transmits an ACK frame 23 and a trigger frame 24 using the channel CH1 by use of the RU 3 and the RU 2 and, at the same time, further transmits a data frame 25 with respect to the AP 4 and a trigger frame 26 specifying the AP 4 using the channel CH2. The RU 10 is used for transmitting the trigger frame 26 and the RU 11 to the RU 13 are used for transmitting the data frame 25. The trigger frame 24 instructs the AP 2 to perform transmission to the AP 3 at the timing t3 (not shown) after elapse of the SIFS and specifies the RU used for the transmission to the AP 3 and the like. The trigger frame 26 instructs the AP 4 to perform transmission to the AP 3 at the timing t3 (not shown) after elapse of the SIFS and specifies the RU used for the transmission to the AP 3 and the like.

Note that the use of the channel CH2 between the AP 3 and the AP 4 may be independently determined by the AP 3 on the basis of a condition of the wireless medium. Alternatively, the channel used between a plurality of APs may be set in advance through negotiation between the APs or the like. When starting the frame transmission using the channel CH2, the AP 3 may confirm that the channel CH2 is in an idle state by a carrier sense on the basis of CSMA/CA or the like.

The AP 2 receives at the timing t2 the trigger frames 22 and 24 from the AP 1 and the AP 3, respectively, but these trigger frames may specify an RU in a duplicated manner. In this case, one of the AP 1 and the AP 3 may be selected to use the duplicated RU for the selected AP. Alternatively, the trigger frames 22 and 24 may respectively specify the all RUs (or omit the specification) such that the AP 2 independently determine the RU used for each of the AP 1 and the AP 3.

The data frame (13, 21, or 25) transmitted in the above sequence may be an aggregation frame in which the plural frames are aggregated (such as an A-MPDU (medium access control (MAC) protocol data unit)). Each of the frames contained in the aggregation frame may be referred to as a subframe. In a case of transmitting the aggregation frame, an acknowledgement response frame that is a response thereto is the BA (Block ACK) frame including acknowledgement information with respect to each subframe.

By transmitting an aggregation frame in which the ACK frame 11 and the trigger frame 12 are aggregated, the ACK frame 11 and the trigger frame 12 may be transmitted by use of the same RU. A destination (RA) of the aggregation frame is the AP 1 and the aggregation frame is transmitted by use of one or more RUs. By transmitting an aggregation frame in which the data frame 13 and the trigger frame 14 are aggregated, the data frame 13 and the trigger frame 14 may be transmitted by use of the same RU. A destination (RA) of the aggregation frame is the AP 3 and the aggregation frame is transmitted by use of one or more RUs.

In the sequences in FIG. 11 and FIG. 12, the trigger frame 14 is transmitted from the AP 2 to the AP 3 at the timing t1, and the trigger frame 22 is transmitted from the AP 1 to the AP 2 at the timing t3, but if the RU used for the responses to the data frames 13 and 21 or a determination method of the RU is determined in advance, the transmission may be configured to omit these trigger frames. For example, this corresponds to such a case that an aggregation frame in which the ACK frame 23 and the trigger frame 24 are aggregated is determined in advance to be returned to the data frame 13 by use of a predetermined RU.

In the sequences in FIG. 11 and FIG. 12, the AP 2 transmits the different trigger frames respectively to the AP 1 and the AP 3 at the timing t1, but one trigger frame may be configured to be transmitted by way of the broadcast or the like to the AP 1 and the AP 3 by use of the same RU. In other words, as shown in FIG. 8, in the OFDMA transmission, the signal for a field until the SIG 1 field is transmitted which is identical across the whole channel band and the signal for a field after the SIG 1 field is transmitted which is different for each RU, but in this case, in the sequence in FIG. 12, the AP 1 and the AP 3 use the different RUs to transmit the trigger frames 12 and 14, respectively. As another method, the same RU may be used to transmit the same trigger frame to the AP 1 and the AP 3.

Figure 13:
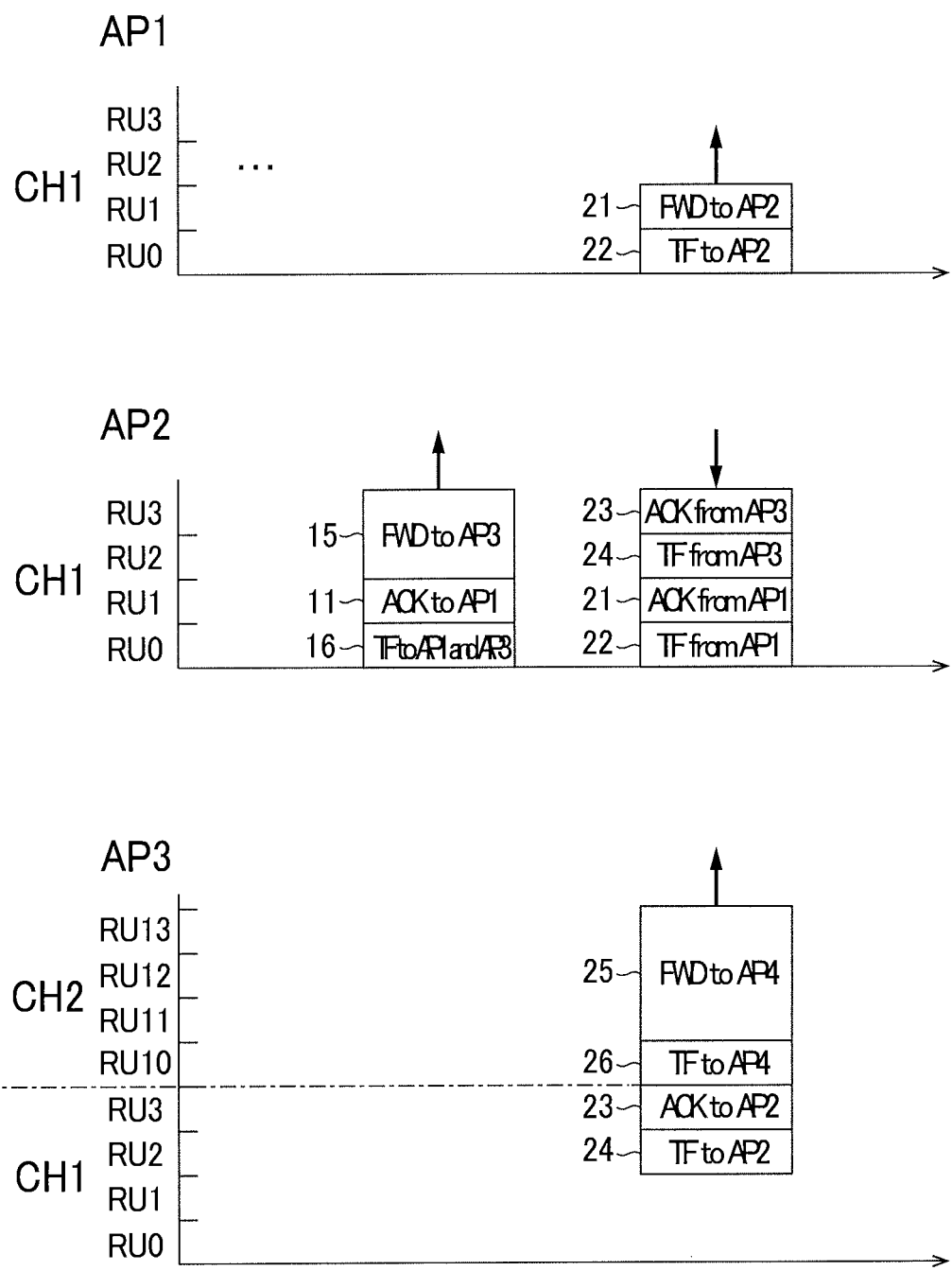
FIG. 13 is a diagram showing an exemplary sequence of the wireless communication system according to the first embodiment.

An exemplary sequence in this case is shown in FIG. 13. The AP 2 transmits to the AP 1 and the AP 3 a trigger frame 16 common to them by use of the RU 0. An RA of the trigger frame 16 is the broadcast address or the like, and two Per User Info fields are provided. One of the Per User Info fields may be set to information on the AP 1 and the other Per User Info field may be set to information on the AP 2. The AP 2 transmits the data frame 15 to the AP 3 by use of the RU 2 as well as the RU 3. This allows the data to be transmitted more than in the sequences in FIG. 11 and FIG. 12. Since the frames 11, 15, and 16 are transmitted by way of the same OFDMA packet, an identical signal for a field until the SIG 1 field is transmitted as shown in FIG. 8.

In the sequences in FIG. 11 and FIG. 12, the AP 3 uses the channel CH2 for the transmission to the AP 4, but may be configured to use the channel CH1. In this case, the AP 3 identifies the RU used by the AP 2 for the reception at the timing t2 on the basis of the trigger frame 14 or the like to determine the RU used for the transmission to the AP 4 so as to avoid the identified RU. For example, assume a case where the channel CH1 includes nine RUs (RU 0 to RU 8). If the AP 3 determines based on the trigger frame 14 that the AP 2 is likely to use the RU 0 to the RU 4, the AP 3 selects the RU used for the transmission to the AP 4 from among the RU 4 to the RU 8.

In the sequences in FIG. 11 and FIG. 12, the AP 2 transmits the ACK frame 11 with respect to the AP 1 together with the trigger frame 12, the trigger frame 14, and the data frame 13, but may transmit only the ACK frame 11 ahead (for example, transmit using the whole channel CH1), and, after elapse of the SIFS from this time, may transmit (by way of the OFDMA) the trigger frame 12, the trigger frame 14, and the data frame 13.

As described above, according to the sequences in FIG. 11 and FIG. 12, the AP 1 can transmit the frame (data frame 21, trigger frame 22) to the AP 2 at the same timing as when the AP 2 receives the ACK frame 23 from the AP 3. In the related art shown in FIG. 9, the AP 1 cannot transmit the frame at the timing when the AP 2 receives the ACK frame 59B from the AP 3 because the interference in the AP 2 is likely to occur. In contrast to this, in the embodiment, the AP 2 transmits the trigger frames 14 and 12 to the AP 3 and the AP 1, respectively at the same time when to transmit the data frame 13 to the AP 3, such that the frame transmissions (OFDMA transmissions) can be simultaneously made from the AP 1 and the AP 3 at the timing t2 after elapse of the SIFS. Therefore, the AP 1 transmits the data frame 21 at the same time when the AP 3 transmits the ACK frame 23 at the timing t2, and the AP 2 can receive these frames simultaneously and accurately (with no interference occurrence). This can suppress occurrence of a time (latency) while the AP 1 cannot transmit a frame. The latency of the AP 1 is focused on here, but the same effect is found in to other AP. In this way, the latency across the whole system can be reduced.

(Second Example of Operation Sequence According to Embodiment)

Figure 14:
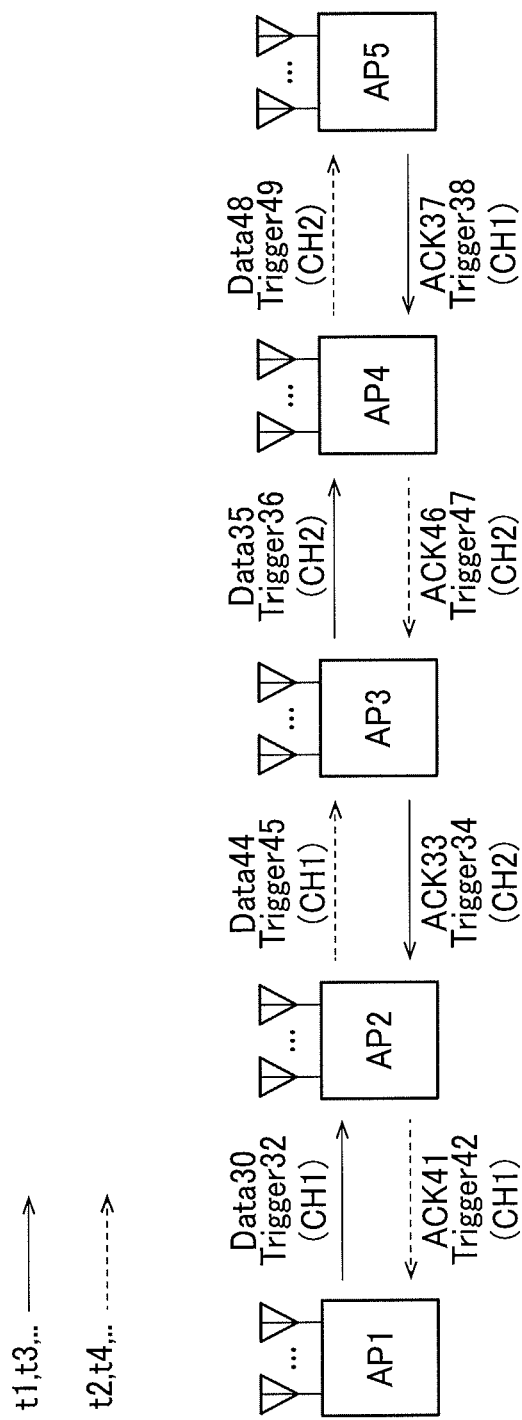
FIG. 14 is a diagram showing an exemplary sequence of the wireless communication system according to the first embodiment.

FIG. 14 is a diagram showing a second example of the operation sequence according to the embodiment. Hereinafter, a description is given of the sequence in the second example, mainly describing a difference from the sequence in the first example. A duplicated description is adequately omitted.

In FIG. 14, at the timings t1, t3, . . . , a frame illustrated along a solid line is transmitted and received in an AP-to-AP direction represented by a solid arrow. At the timings t2, t4, . . . , a frame illustrated along a dashed line is transmitted and received in an AP-to-AP direction represented by a dashed arrow. The timing t2 is, as an example, a timing after elapse of the SIFS from the timing t1, the timing t3 is, as an example, a timing after elapse of the SIFS from the timing t2, and the timing t4 is, as an example, after elapse of the SIFS from the timing t3, without limitation. The operation in the direction of the solid line and the operation in the direction of the dashed line are alternately performed.

In the sequences in the first example described in FIG. 11 and FIG. 12, only the channel CH1 is used among the AP 1, AP 2, and AP 3, but the channel CH1 and the channel CH2 are used in the second example. The channel CH2 and the channel CH1 are also used among the AP 3, AP 4, and AP 5.

As shown in FIG. 14, at the timing t1, the AP 1 transmits a data frame 30 and a trigger frame 32 to the AP 2 using the channel CH1, at the same time as which the AP 3 simultaneously transmits an ACK frame 33 and a trigger frame 34 to the AP 2 using the channel CH2. In other words, the AP 2 uses two channels CH1 and CH2 to perform OFDMA receptions from AP 1 and the AP 3. In addition, at the timing t1, the AP 3 transmits a data frame 35 and a trigger frame 36 to the AP 4 using the channel CH2, at the same time as which the AP 5 transmits an ACK frame 37 and a trigger frame 38 to the AP 4 using the channel CH1. In other words, the AP 4 uses two channels CH1 and CH2 to perform OFDMA receptions from AP 3 and the AP 5. From the viewpoint of the AP 3, the AP 3 uses the channel CH2 to perform the OFDMA transmission to the AP 2 and the AP 4. The RU used by the AP 3 for the transmission to the AP 2 is different from the RU used by the AP 3 for the transmission to the AP 4.

At the timing t2 after elapse of the SIFS, the AP 1 receives an ACK frame 41 and a trigger frame 42 from the AP 2 using the channel CH1 (in response to the trigger frame 32). At the same time as this time, a trigger frame may be received using the channel CH2 from another AP not shown (for example, an AP existing on a further downstream) or a terminal. The AP 3 receives a data frame 44 and a trigger frame 45 from the AP 2 using the channel CH1 (in response to the trigger frame 34), and at the same time as this, receives an ACK frame 46 and a trigger frame 47 from the AP 4 using the channel CH2 (in response to the trigger frame 36). The AP5 receives a data frame 48 and a trigger frame 49 from the AP 4 using the channel CH2 (in response to the trigger frame 38).

Note that each AP communicates with also a plurality of terminals belonging to its BSS to receive relay data and so on.

At the timing t3 further after elapse of the SIFS, the same types of frames as at the timing t1 are transmitted and received among the APs. Moreover, at the timing t4 further after elapse of the SIFS, the same types of frames as at the timing t2 are transmitted and received among the APs. Subsequently, the operation is repeated similarly.

In the sequence described in the second example, focusing on the AP 2, the transmission from the AP 2 does not overlap the transmission from the AP 1 (when the AP 2 transmits, the AP 1 does not transmit), and thus, the AP 2 uses, in the transmission at the timing t2, the same the channel CH1 which the AP 1 used for the transmission to the AP 2 at the timing t1. On the other hand, since the transmission from the AP 1 to the AP 2 and the transmission from the AP 3 to the AP 1 are simultaneously performed, the AP 1 uses the channel CH1 while the AP 3 uses the channel CH2 other than CH1 for the transmission to the AP 2. In other words, the AP 2 uses only the channel CH1 in the transmission and uses both the channels CH1 and CH2 in the reception. The AP 2 is focused on here, but other APs (APs on both end sides may be eliminated) also use one or both of the channels CH1 and CH2 in the transmission and use both the channels CH1 and CH2 in the reception. This can prevent a collision from occurring in each AP when it simultaneously receives from the adjacent two APs. A further another AP may exist on the downstream side of the AP 1 (on a side farther from the wired network 31) and a further another AP may exist on the upstream side of the AP 5 (on a side closer to the wired network 31). In these cases, the AP 1 or the AP 5 also uses both the channels CH1 and CH2 for the reception.

In the sequence described in the first example, as shown in FIG. 11, the AP 3 uses channel CH1 to transmit the ACK frame 23 and the trigger frame 24 to the AP 2 while the AP 1 uses the RU different from the RU used for the transmission to the AP 2, preventing the interference in the AP 2 (see FIG. 11 and FIG. 12). In contrast to this, in the sequence in the second example, the channel CH2 different from the channel CH1 which is used by the AP 1 for the transmission is used to prevent the interference in the AP 2.

Two channels are used in the sequence in the second example, but the AP closer to the wired network 31 may use a larger number of channels for the data transmission. For example, three channels (channels CH1, CH2, and CH3) may be used in the transmission from the AP 3 to the AP 4, and those three channels or four channels (CH1, CH2, CH3, and CH4) may be used in the transmission from the AP 4 to the AP 5. By doing so, in a case where the closer to the wired network, the more the data volume to be forwarded, the latency across the whole system can be suppressed.

(Third Example of Operation Sequence According to Embodiment)

Figure 15:
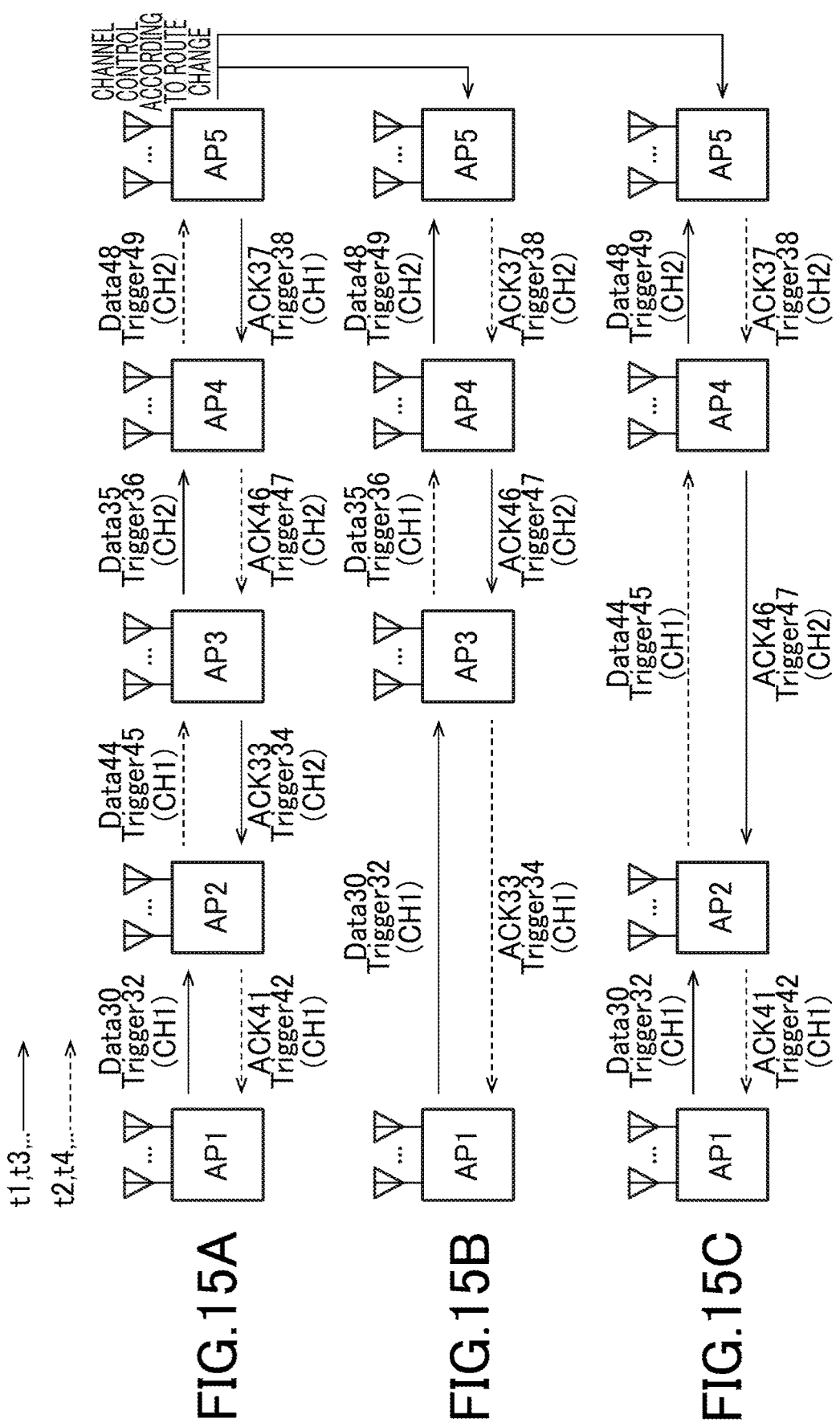
FIGS. 15A to 15C each shows exemplary sequences of the wireless communication system according to the first embodiment.

FIGS. 15A-15C are diagrams showing a third example of the operation sequence according to the embodiment.

Hereinafter, a description is given of the sequence in the third example, mainly describing a difference from the sequence in the second example. A duplicated description is adequately omitted.

FIG. 15A is the same as FIG. 14 according to the second exemplary sequence. In this example, a forward route of the data is shown as AP 1→AP 2→AP 3→AP 4→AP 5. In this state, assume that a forward destination of the AP 1 is changed from the AP 2 to the AP 3 by route change control as shown in FIG. 15B. Examples of a case where the route is to be changed may include a case where communication quality between the AP 1 and the AP 2 is decreased to not meet a predetermined criteria (as an example, an SINR (signal to interference plus noise ratio) of a received signal decreases below a predetermined value, for example, in a received signal from the AP 1 to the AP 2). FIG. 15B shows an operation sequence in the case where the forward destination of the AP 1 is changed to the AP 3.

As shown in FIG. 15B, if the forward destination of the AP 1 is changed to the AP 3, the AP 1 changes the transmission destination (RA) of each of the data frame 30 and the trigger frame 32 to the AP 3. The AP 1 uses the channel CH1 the same as that before the forward destination change to transmit (by way of the OFDMA) the data frame 30 and the trigger frame 32 to the AP 3. The AP 1 sets, in the trigger frame 32, information for instructing the AP 3 to perform a trigger response using the channel CH1. The field set to the relevant information is the Per User Info field for the AP 3 as an example, without limitation.

The AP 3 determines to response to the AP 1 using the channel CH1 on the basis of the information set in the trigger frame 32. In other words, on the basis that the channel CH1 is used for the reception from the AP 1 and is specified for the transmission, the AP 3 determines to change a channel used for the transmission to the AP 4 from the channel CH2 to the channel CH1. At the timing t2, the AP 3 transmits the data frame 35 and the trigger frame 36 to the AP 4 using the channel CH1 as well as transmits (by way of the OFDMA) the ACK frame 33 and the trigger frame 34 to the AP 1. The AP 3 may set, in the trigger frame 36 transmitted to the AP 4, information for instructing the AP 4 to perform a trigger response using the channel CH2 the same as that before the forward destination change (that is, a channel different from the channel CH1 used for the reception from the AP 1). Alternatively, because of no change in the channel to perform the trigger response, this information setting may be omitted.

The AP 4 receives (by way of the OFDMA reception) the trigger frame 36 and the data frame 35 from the AP using the channel CH1. At this time, the AP 4 receives the ACK frame 37 and the trigger frame 38 from the AP 5 using the same channel CH1, which may cause a collision (the AP 5 is not yet instructed to change the channel CH1). In this case, the AP 3 retransmits the data frame 35 to the AP 4 because of being incapable of receiving an ACK frame from the AP 4, as an example. The AP 4 retransmits the data frame 48 because of being incapable of receiving an ACK frame from the AP 5, and, at this time, simultaneously transmits the trigger frame 49. In the trigger frame 49 information is set for instructing the AP 5 to perform a trigger response using the channel CH2 (different from the channel CH1 used for the reception from the AP 3).

The AP 5 determines to change the channel used for the response to the AP 4 to the channel CH2 on the basis of the information set in the trigger frame 49. The AP 5 uses the channel CH2 to transmit (by way of the OFDMA) the ACK frame 37 and the trigger frame 38 to the AP 4. The AP 4 uses the channels different between the OFDMA reception from the AP 3 and the OFDMA reception from the AP 5 such that it can normally receive the signals transmitted from both the AP 3 and the AP 5.

FIG. 15C shows a case where in the state of FIG. 15A the forward destination of the AP 2 is changed from the AP 3 to the AP 4. In this case also, channel change control is performed in accordance with an algorithm similar to that in FIG. 15B. Concretely, the channel used for the transmission from the AP 5 to the AP 4 is changed from the channel CH1 to the channel CH2. In other words, the AP 4 determines, on the basis of using the channel CH1 for the OFDMA reception from the AP 2 after the route change, that the channel used for the OFDMA reception from the AP 5 needs to be changed to the channel CH2 different from the channel CH1. Based on the determination, the AP 4 sets, in the trigger frame 49 transmitted to the AP 5, information for instructing to perform a trigger response using the channel CH2.

(Fourth Example of Operation Sequence According to Embodiment)

Figure 16:
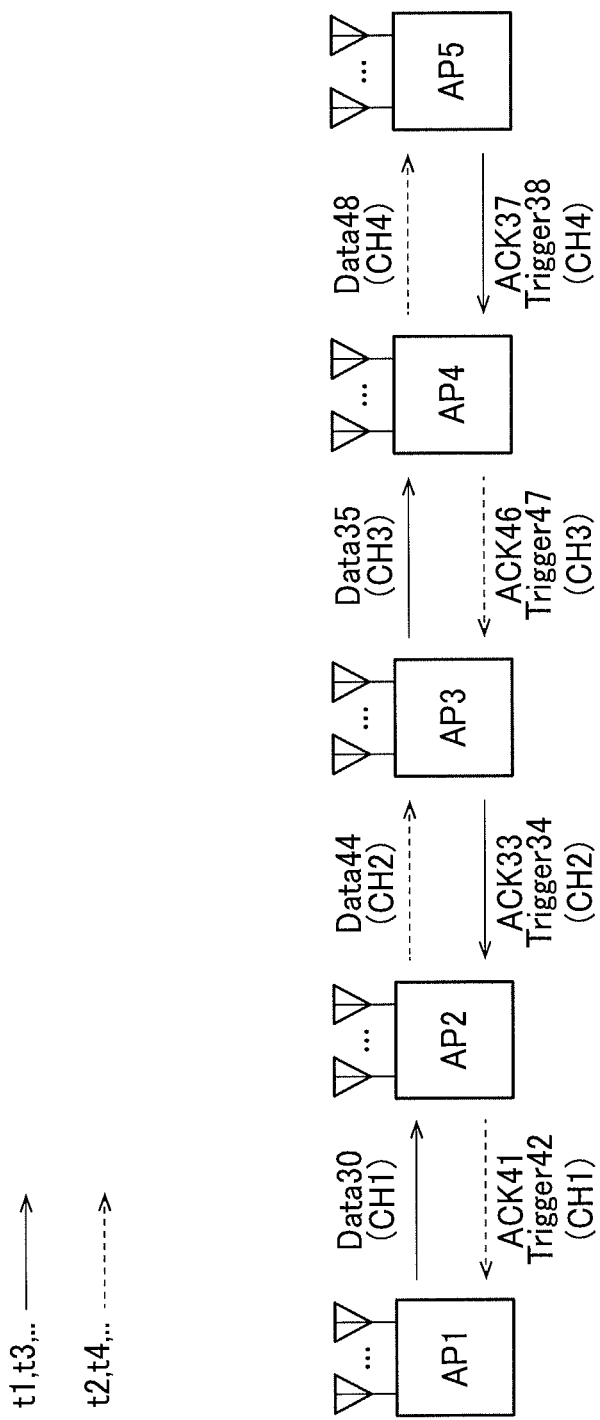
FIG. 16 is a diagram showing an exemplary sequence of the wireless communication system according to the first embodiment.

FIG. 16 is a diagram showing a fourth example of the operation sequence according to the embodiment. The frames the same as or corresponding to the frames transmitted or received in the sequences in the second example in FIG. 14 are designated by the same reference signs. Hereinafter, a description is given mainly of a difference from the sequence in FIG. 14.

In the sequences in the second example in FIG. 14, each AP uses one channel for the OFDMA transmission (one of the channels CH1 and CH2), but in this sequence in FIG. 16, each AP simultaneously uses two channels for the OFDMA transmission. In this case, one channel is used to transmit an ACK frame and a trigger frame to an adjacent AP on the downstream side and the other channel is used to transmit a data frame to an adjacent AP on the upstream side. For example, the AP 2 transmits the data frame 44 to the AP 3 using the channel CH2, and at the same time, transmits the ACK frame 41 and the trigger frame 42 to the AP 1 using the channel CH1. Each AP uses the channel used for the reception from the adjacent AP on the downstream side to perform the response. For example, the AP 3 receives the data frame 44 from the AP 2 using the channel CH2, and therefore, uses the channel CH2 to perform the response (i.e., the transmission of the ACK frame 33 and the trigger frame 34). This eliminates the need for the AP 2 to transmit the trigger frame to the AP 3 at the same time as transmitting the data frame 44 to the AP 3 (that is, there is no need to specify the AP 3 to the channel used for the trigger response). The description here is given focusing on the AP 2, but the same holds for the other APs.

In the sequence in FIG. 16, one channel entirely can be used to transmit the data frame (data forward), which is suitable for a case of a large data volume to be forwarded. However, many channels are needed. Note that when the ACK frame and the trigger frame are transmitted to the adjacent AP on the downstream side (for example, when the ACK frame 41 and the trigger frame 42 are transmitted from the AP 2 to the AP 1), the data frame may also be transmitted at the same time. For example, if one channel includes four RUs, one RU may be allocated to each of the ACK frame 41 and the trigger frame 42 to transmit the data frame by use of the rest two RUs. This goes for the other embodiments described above or later.

(Fifth Example of Operation Sequence According to Embodiment)

Figure 17:
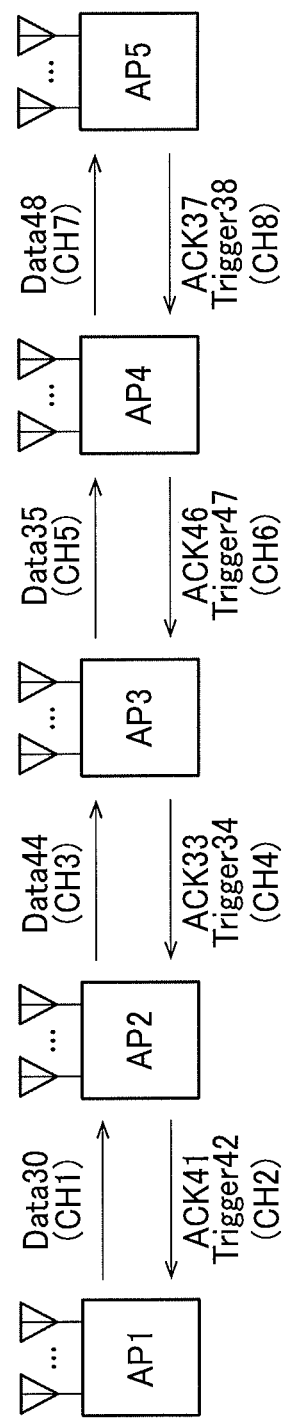
FIG. 17 is a diagram showing an exemplary sequence of the wireless communication system according to the first embodiment.

FIG. 17 is a diagram showing a fifth example of the operation sequence according to the embodiment. The frames the same as or corresponding to the frames transmitted or received in the sequences in the fourth example in FIG. 16 are designated by the same reference signs. A description is given mainly of a difference from the sequence in FIG. 16.

In the sequence of the fourth example described in FIG. 16, each AP uses two channels to simultaneously perform the transmissions (OFDMA transmission) to the adjacent AP on the downstream side and the adjacent AP on the upstream side, and uses two channels to simultaneously perform the receptions (OFDMA reception) from the adjacent AP on the downstream side and the adjacent AP on the upstream side. For example, the AP 2 uses the channels CH1 and CH2 at the timings t2, t4 . . . to simultaneously transmit to the AP 1 and the AP 3 and uses the channels CH1 and CH2 at the timings t1, t3 . . . to simultaneously receive from the AP 1 and the AP 3. In this way, the reception and the transmission are performed at different timings.

In contrast to this, in the sequence in FIG. 17, while two channels different between reception and transmission are used, the reception (OFDMA reception) and the transmission (OFDMA transmission) are simultaneously performed. In other words, each AP uses four channels to perform full duplex communication. In the example, the transmission of the data frame (data forward) is enabled at each of the timings t1, t2, t3, t4 . . . , differently from the sequences described in the first to fourth examples. In the example, since the timings do not need to be distinguished between the transmission and the reception, dashed arrows are not illustrated.

As shown in FIG. 17, the AP 1 simultaneously performs the transmission to the AP 2 using the channel CH1 and the reception from the AP 2 using the channel CH2.

The AP 2 simultaneously performs the transmission to the AP 1 using the channel CH2, the transmission to the AP 3 using the channel CH3, the reception from the AP 1 using the channel CH1, and the reception from the AP 3 using the channel CH4.

The AP 3 simultaneously performs the transmission to the AP 2 using the channel CH4, the transmission to the AP 4 using the channel CH5, the reception from the AP 2 using the channel CH3, and the reception from the AP 4 using the channel CH6.

The AP 4 simultaneously performs the transmission to the AP 3 using the channel CH6, the transmission to the AP 5 using the channel CH7, the reception from the AP 3 using the channel CH5, and the reception from the AP 5 using the channel CH8.

In this way, each AP uses the channels (four in total) different between the transmission to the adjacent AP on the downstream side, the transmission to the adjacent AP on the upstream side, the reception from the adjacent AP on the downstream side, and the reception from the adjacent AP on the upstream side which are simultaneously performed. Many channels are used, but this can efficiently suppress the latency across the whole system in the case of a large data volume to be forwarded. If the AP 1 and the AP 5 are sufficiently far away from each other to be in a state not interfering with each other, the AP 5 can use not the channel CH8 but the channel CH1 for the transmission to the AP 4. In other words, the identical channel can be repeatedly used also. Which channel each AP uses may be determined in advance through negotiation between the APs or may be defined in a system specification. Alternatively, the carrier sense may be performed to find an idle channel and use the found channel.

Figure 18:
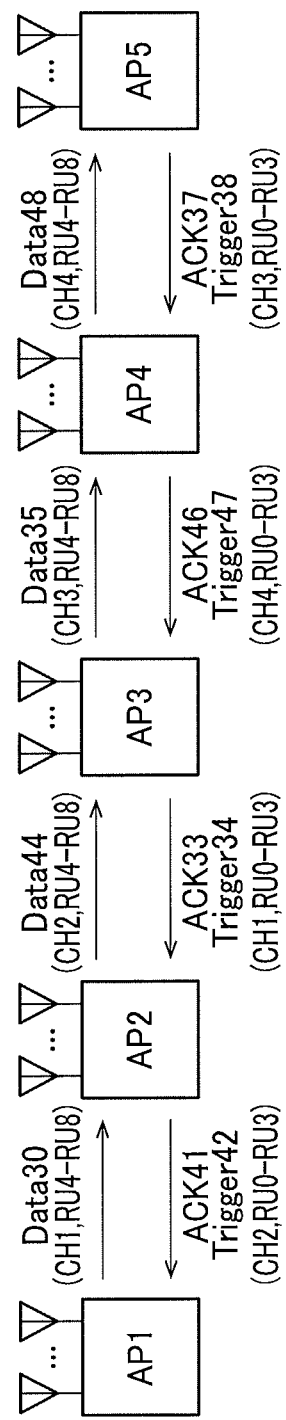
FIG. 18 is a diagram showing an exemplary sequence of the wireless communication system according to the first embodiment.

FIG. 18 is a diagram showing a fifth another example of the operation sequence according to the embodiment. A description is given mainly of a difference from the sequence in FIG. 17.

Similarly to the sequence described in FIG. 17, each AP can perform the full duplex communication. However, in the sequence described in FIG. 17, the all RU included in one channel are used for the same AP, but in the sequence in FIG. 18, the RUs included in one channel are allocated to a plurality of APs to use the allocated RU. For example, the AP 2 uses the channel CH1 to simultaneously perform the receptions from the AP 1 and the AP 3 and uses the channel CH2 to simultaneously perform the transmissions to the AP 3 and the AP 1, where these receptions and transmissions are simultaneously performed. Concretely, the AP2 receives the data frame 30 from the AP 1 using the RU 4 to the RU 8 in the channel CH1, and at the same time, receives the trigger frame 34 and the ACK frame 33 from the AP 3 using the RU 0 to the RU 3 in the channel CH1. Moreover, the AP 2 transmits the data frame 44 to the AP 3 using the RU 4 to the RU 8 in the channel CH2, and at the same time, transmits the ACK frame 41 and the trigger frame 42 to the AP 1 using the RU 0 to the RU 3 in the channel CH2.

In this way, each AP can perform the full duplex communication not in units of channel but in units of RU.

(Sixth Example of Operation Sequence According to Embodiment)

FIGS. 19A-19B are diagram showing a sixth example of the operation sequence according to the embodiment. Hereinafter, a description is given mainly of a difference from the sequence described in FIG. 14 (the second example of the operation sequence according to the embodiment).

FIG. 19A is based on the sequences in the second example described in FIG. 14. However, each AP does not transmit a trigger frame to adjacent AP on the upstream side. For the purpose of illustration, the sequences only at the timings t1 and t2 are illustrated.

The AP 3 receives the data frame 44 from the AP 2 at the timing t2 using the channel CH1. The AP 3 also receives the ACK frame 46 and the trigger frame 47 from the AP 4 using the channel CH2. At this time, assume that the AP 3 detects out-of-synchronization between the AP 2 and the AP 4 from a difference between the timing of the reception from the AP 2 and the timing of the reception from the AP 4.

The out-of-synchronization may be detected in a case where the packets or frames received from the AP 2 and the AP 4 are failed to be decoded. For example, there may be included in this case a failure in decoding the physical header, and a failure in the CRC check of the frame. Even in a case of successful decoding, if a difference between the reception timings are large (for example, the difference is equal to or larger than a threshold, or the like), out-of-synchronization occurrence may be detected.

FIG. 19B shows an operation in a case where the AP 3 detects the out-of-synchronization between the AP 2 and the AP 4. The AP 3 receives from the AP 2 at the timing t2, but receives from the AP 4 at a timing (t2+4). This causes the AP 3 to detect the out-of-synchronization between the AP 2 and the AP 4 in accordance with the determination described above.

If the AP 3 detects the out-of-synchronization, the AP 3 operates to correct the out-of-synchronization to obtain a synchronization with the timing of the AP 2 on the downstream side (data forwarder side). The AP 3 transmits the trigger frame 51 (not the data frame) to the AP 4 using the channel CH2 after elapse of a certain time period from a time point of the timing t2 when it receives from the AP 2 (assuming that the AP 3 starts to receive the packet from the AP 2 at the time point of the timing t2). Concretely, the trigger frame 51 is transmitted at the timing t3 obtained by adding the packet length (PPDU length) and a certain time period (which is the SIFS here, but may be another time period) to the time point of the timing t2. The packet length may be defined in advance or a value of the packet length may be detected from a packet header in a case of successful decoding of the packet header. The AP 4 transmits the trigger frame 34 to the AP 2 using the same channel CH2 (of course, the RU to be used is different) at the same timing t3 (in a case of successful reception of the data frame 44 at the timing t2, the ACK frame 33 may be transmitted together with the trigger frame 34). If the ACK frame 33 is not transmitted, the AP 2 determines that the data frame 44 transmitted at the timing t2 is failed to be transmitted, and therefore, the AP 2 retransmits the data frame at the next timing t4 (not shown). Once the AP 4 receives the trigger frame 51 at the timing t3, it determines that the ACK frame 46 previously transmitted (at the timing t2+4) is failed or likely to be failed to be transmitted, and therefore, transmits the ACK frame 46 for retransmission together with the trigger frame 47 at the next timing t4 (not shown) using the channel CH2.

In the operation described above, the AP 3 transmits the trigger frame 51 to the AP 4 and the trigger frame 34 to the AP 2 at the timing t3 (which is obtained by adding the packet length (PPDU length) and the SIFS to the time point of the timing t2), but may use a timing calculated in another way. For example, the AP 3 may perform the transmission after elapse of a certain time period (SIFS or the like) from when it detects that the wireless medium becomes the idle state from the busy state after receiving from the AP 2 at the timing t2.

In the operation described above, the trigger frame 34 is transmitted to the AP 2 at the timing t3, but the trigger frame 34 may not be transmitted (that is, nothing is transmitted to the AP 2 at the timing t3). The AP 2 retransmits the data frame 44 at the next timing t4 after elapse of a certain time period (even if it does not receive the trigger frame 34) because of being incapable of receiving the ACK frame 33 at the timing t3. In this case, the RU to be used may be determined in advance, such as the RU the same as the previous one.

Correction of the out-of-synchronization between the AP 2 and the AP 4 by the above described measure may cause out-of-synchronization to be detected between the APs on the further downstream side (forwarder side)(e.g., between the AP 1 and the AP 3) and the like. In this case, the AP 2 operates to correct the out-of-synchronization by the measure described above. As a result, the AP 3 may detect again out-of-synchronization in some cases, but the AP 3 corrects the out-of-synchronization again. After that, each AP further corrects out-of-synchronization sequentially toward the wired network side to eliminate the out-of-synchronization across the whole system.

Figure 20:
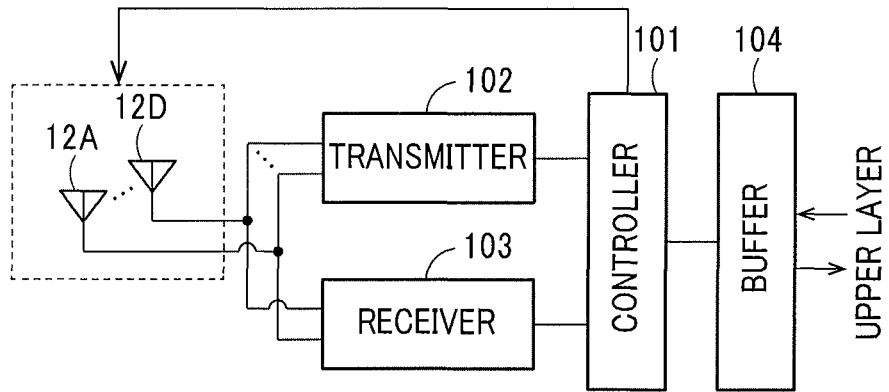
FIG. 20 is a block diagram of an access point according to the first embodiment.

FIG. 20 is a functional block diagram of the wireless communication device equipped in AP. The terminal as used in the following description may refer to an AP unless an operation specific to a non-AP terminal is performed.

The wireless communication device of the AP includes antennas 12A, 12B, 12C and 12D, a controller 101, a transmitter 102, a receiver 103, and a buffer 104. The number of the antennas is four although the number may be one or more. The number of the antennas may be one.

The directivity of the antennas 12A to 12D may or not be variable as an example. Here, the directivity variable antenna is used. The directivity setting is performed by the controller 101. The respective antennas may have directivities different from each other to control the directivity by switching the antennas to use, or the directivity may be controlled by means of synthesis of entire the antennas 12A to 12D. As an example, the omnidirectional directivity, the directivity in FIG. 2A, and the directivity in FIG. 2B can be switched over to each other. As example, the directivity in FIG. 2A may be used in communicating with the terminal in the BSS of the AP's own and the directivity in FIG. 2B may be used in communicating with the adjacent AP. Alternatively, the omnidirectional directivity may be always used.

The controller 101 corresponds to controlling circuitry or a baseband integrated circuitry which controls communication with the terminals, and the transmitter 102 and the receiver 103 form a wireless communicator or an RF (Radio Frequency) integrated circuitry which transmits and receives frames via the antennas 12A to 12D. A process of the controller 101, and all or a part of a digital domain process of the transmitter 102 and the receiver 103 may be performed by software (program) executing on a processor such as a CPU, or may be performed by hardware, or may be performed by the both of software and hardware. The AP may include a processor performing all or a part of the process of the controller 101, the transmitter 102 and the receiver 103.

The buffer 104 is a storage for transferring a frame or data between an upper layer and the controller 101. The buffer 104 may be a volatile memory such as a DRAM or a non-volatile memory such as a NAND, or an MRAM.

The upper layer may store the frame received from another network or other AP, or a payload thereof (such as the data) in the buffer 104 for relaying to the non-AP terminal or the AP. The upper layer may receive via the buffer 104 the frame received from the non-AP terminal or the AP, or the payload (such as the data) thereof.

The upper layer may perform an upper communication process than a MAC layer such as a TCP/IP or a UDP/IP. Alternatively, the TCP/IP or a UDP/IP may be performed in the controller 101 and the upper layer may also perform a process of an application layer of processing the data upper that the TCP/IP or the UDP/IP. An operation of the upper layer may be performed by software (program) processing by a processor such as a CPU, or may be performed by hardware, or may be performed by the both of the software and the hardware.

The controller 101 mainly performs a process of the MAC layer, and a part or all of a process of a physical layer. The process of a physical layer includes a process concerning the OFDMA. The controller 101 may perform a multiuser-communication other than the OFDMA such as a process concerning the MU-MIMO or the like, or may perform a method in combination with the OFDMA and the MU-MIMO. The controller 101 performs operations corresponding to the operation sequences from the first example to the sixth example in order to perform efficient data forward between the APs.

The controller 101 transmits and receives the frame (more specifically, the physical packet having the physical header added to the frame) via the transmitter 102 and the receiver 103. The controller 101 may also control so as to periodically transmit a beacon frame for notifying attribute information and synchronization information etc. on BSS (Basic Service Set) of the AP. The controller 101 may include a clock generator generating a clock and manage an internal time using the clock generated by the clock generator. The controller 101 may output externally the clock created by the clock generator. Additionally, the controller 101 may be configured to receive the clock externally input and manage an internal time using the clock.

The controller 101, on receiving an association request from the terminal belonging to its BSS, performs an association process to exchange required information on capability or an attribute etc. each other and establishes the wireless link with the terminal. The controller 101 may perform a process such as an authentication process if necessary before receiving the association request. The controller 101 may acquire information concerning, as capability information of the terminal, whether to be compliant with the OFDMA. The capability information may be acquired as a response to transmission of a request to transmit the capability information when not at the association process but at any timing after that.

The controller 101 periodically checks the buffer 104 to confirm the state of the buffer 104 such as existence or non-existence of data for downlink transmission. Alternatively, the controller 101 may check the buffer 104 according to a trigger given from an external device as such the buffer 104.

The controller 101, when creating and transmitting the frame (more specifically, the physical packet having the physical header added to the frame), as an example, performs the carrier sensing in accordance with the CSMA/CA before the transmission, and if a carrier sensing result shows being idle state (if a value of the CCA is equal to or less than a threshold), the access right to the wireless medium is acquired. The controller 101 subjects the frame to processes such as encode and a modulation process based on the MCS to output to a transmitter 102. The transmitter 102 subjects the input frame (more specifically, the physical packet having the physical header added thereto) to DA conversion, a filtering process to extract components of a desired band, frequency conversion (up-conversion) and the like to amplify signals obtained through these processes by a pre-amplifier and radiate the amplified signals as radio waves from the antennas 12A to 12D into the space.

The controller 101 may generate a trigger frame as a frame to be transmitted (see FIG. 10). In the trigger frame, as described above, the information specifying one or more APs (or terminals), and the parameter information (the RU or channel used for transmission or both of them) are set. As the parameter information, the classification of the frame to be transmitted (data frame, ACK frame, trigger frame, or the like) or the transmission timing may be specified.

The signals received by the antennas 12A to 12D are processed in the receiver 103 for each reception system corresponding to the each antenna. The received signal of each antenna is amplified by a low noise amplifier (LNA) in the corresponding reception system, is subjected to frequency conversion (down-convert), and is subjected to a filtering process, thereby allowing a desired band component to be extracted. The extracted signals are further converted into digital signals through AD conversion and input to the controller 101. The digital signals in the reception systems are synthesized by a diversity technique, as an example. The synthesis may be performed in a state of analog signals before converted to the digital signals. In the case of the OFDMA, a component may be extracted for each RU or channel and input to the controller 101.

The controller 101 subjects the input signals to processes such as demodulation and error-correcting decode to acquire the frame. In the case of the OFDMA reception, demodulation and error-correcting decode for each RU or channel is carried out to acquire the frame for each RU or channel. In the case of the MU-MIMO reception, the space separation signals for each sender terminal may be used to separate the received signals to acquire a plurality of frames. The controller 101 carries out the CRC check of the received frame (in a case of the aggregation frame, the CRC check is carried out for the plural subframes in the aggregation frame). The controller 101 transmits the acknowledgement response frame (more specifically, the packet having the physical header added thereto) after elapse of a predefined time period (the SIFS or the like) from the completion of receiving the frame from each terminal. In a case where the frame is the aggregation frame, the acknowledgement response frame is the BA frame. The controller 101 receives a trigger frame from another AP, and in a case where the AP of its own is specified in the trigger frame, generates and transmits one or more frames (or the aggregation frame) in accordance with the parameter information set for the AP of its own (e.g., the frequency resource information such as the RU or channel, the PPDU length information, the frame classification information). The transmitter 102 subjects the acknowledgement response frame to DA conversion, a filtering process to extract components of a desired band, frequency conversion (up-conversion) and the like to amplify signals obtained through these processes by a pre-amplifier and radiate the amplified signals as radio waves from the plural antennas into the space.

The controller 101 may access a storage for storing the information to be transmitted via the frame to the terminal or the information received from the terminal, or the both of these to read out the information. The storage may be an internal memory, an external memory, a volatile memory, or a non-volatile memory. The storage may also be an SSD, a hard disk or the like other than the memory.

The above described isolation of the processes of the controller 101 and the transmitter 102 is an example, and another form may be used. For example, the controller 101 may perform the process until the digital domain process and the DA conversion, and the transmitter 102 may perform process subsequent to the DA conversion. As for the isolation of the processes of the controller 101 and the receiver 103, similarly, the receiver 103 may perform the process before the AD conversion and the controller 101 may perform the digital domain process including processes following the AD conversion.

As one example, the baseband integrated circuit in accordance with this embodiment corresponds to the section that carries out the processing of digital domain, the section that carries out the processing of the DA conversion in the transmission, and the section that carries out the processing processes including and following the AD conversion in the reception. The RF integrated circuit corresponds to the section that carries out the processing processes following the DA conversion in the transmission and the section that carries out the processing processes prior to the AD conversion in the reception. The integrated circuit for the wireless communication in accordance with this embodiment includes at least a baseband integrated circuit from the baseband integrated circuit and the RF integrated circuit. The processing processes between blocks or processing processes between the baseband integrated circuit and the RF integrated circuit may be isolated from each other in accordance with any method other than those described herein.

Figure 21:
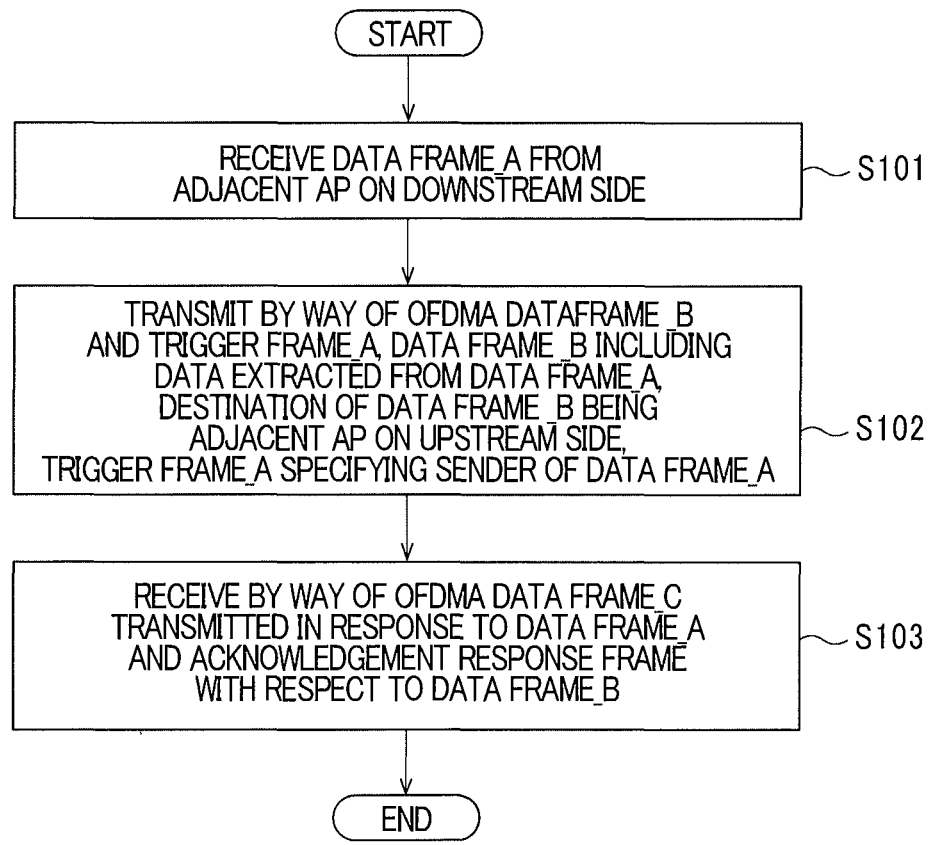
FIG. 21 is a flowchart of an exemplary operation of the access point.

FIG. 21 is a flowchart of an exemplary operation of the AP (relay station) according to the embodiment. The AP receives the frame including the data (referred to as data frame_A) from the adjacent AP on the downstream side of itself (or terminal belonging to the BSS of itself) (S101).

The AP extracts data contained in the received data frame_A, and, in order to forward the data, generates a data frame (referred to as a data frame_B) containing the extracted data and addressed to an AP different from the sender AP of the data frame_A (more concretely, the adjacent AP on the upstream side of itself). The generated data frame_B and a trigger frame (referred to as a trigger frame_A) specifying the sender AP of the data frame_A are simultaneously transmitted by way of the OFDMA (frequency multiplexing) (S102). The AP may further simultaneously transmit by way of the relevant OFDMA an acknowledgement response frame with respect to the data frame_A or can transmit that acknowledgement response frame previously to the relevant the OFDMA. In a case where the data included in the data frame_A is that with respect to the AP itself, the data is stored in the buffer of the AP itself and the relevant date does not need to be forwarded.

Here, the AP specifies, in the trigger frame_A, the frequency resource (RU or channel or both) used for the trigger response to the sender AP. The specified frequency resource is to be different from a frequency resource which is used for the acknowledgement response frame (ACK frame or the like) transmitted by the transmission destination AP of the data frame_B after elapse of the SIFS. Here, the AP grasps in advance the frequency resource used to transmit the acknowledgement response frame (for example, the acknowledgement response frame is returned by use of a predetermined frequency resource, and so on). The AP may explicitly specify a timing of the trigger response (next transmission timing) in the trigger frame_A for the sender AP of the above data frame_A.

After elapse of a certain time period (the SIFS of the like) from the OFDMA transmission, the AP simultaneously receives by way of the OFDMA (frequency multiplexing) a data frame (referred to as data frame_C) transmitted from the sender AP of the data frame_A and an acknowledgement response frame (ACK frame or the like) with respect to the data frame_B transmitted from the transmission destination AP of the data frame_B (S103).

In the operation of the above flowchart, the adjacent AP on the upstream side of the AP transmits the acknowledgement response frame (ACK frame) in response to the data frame_B, but may transmit other frame than the ACK frame. For example, if the data frame_B is a frame not requesting for an acknowledgement response, the adjacent AP on the upstream side may transmit another kind of frame such as the data frame.

The AP specifies the sender AP of the data frame_A (adjacent AP on the downstream side) in the trigger frame_A, but may further specify the adjacent AP on the upstream side. This may also allow the trigger frame_A to control a timing of and a frequency resource (RU or channel or both) used for the next frame transmission by the AP on the upstream side. In this case, as for a resource amount of the frequency resource specified in the trigger frame_A, a resource amount specified for the adjacent AP on the downstream side may be larger than a resource amount specified for the adjacent AP on the upstream side. This allows a data frame containing a large data volume to be received from the AP on the downstream side when the adjacent AP on the upstream side transmits an acknowledgement response frame, improving the efficiency of the data forward.

The trigger frame transmitted from the AP to the adjacent AP on the upstream side may be a frame (referred to as a trigger frame_B) different from the trigger frame transmitted from the AP to the adjacent AP on the downstream side. In this case, the trigger frame_B transmitted to the adjacent AP on the upstream side may be simultaneously transmitted by way of the OFDMA together with above data frame_B and the trigger frame_A transmitted to the adjacent AP on the downstream side. In this case, the resource amount of the frequency resource specified in the trigger frame_A may be larger than the resource amount of the frequency resource specified in the trigger frame_B. This allows the usage efficiency of the whole channels to be improved for the reason similar to the above.

The AP may transmit an aggregation frame in which the acknowledgement response frame with respect to the data frame_A received from the adjacent AP on the downstream side and the trigger frame_A specifying the adjacent AP on the downstream side are aggregated. In the case where the AP transmits the above trigger frame_B to the adjacent AP on the upstream side, the AP may transmit an aggregation frame in which the relevant trigger frame_B and the data frame_B are aggregated.

The AP may use the channels different between the transmission and the reception in communicating with the adjacent AP on the downstream side and the adjacent AP on the upstream side. In this case, the channels used for the transmission may be the same or different between the transmission to the adjacent AP on the downstream side and the transmission to the adjacent AP on the upstream side. The channels used for the reception may be the same or different between the reception from the adjacent AP on the downstream side and the reception from the adjacent AP on the upstream side.

The AP may operate to correct out-of-synchronization in a case of detecting out-of-synchronization between a reception timing of a frame transmitted in response to the trigger frame_A specifying the adjacent AP on the downstream side, and a reception timing of a frame transmitted in response to at least one of the data frame_B or the trigger frame_B. In other words, at a timing after elapse of a time period calculated by a predefined method from the reception timing of the frame transmitted in response to the above trigger frame_A, a trigger frame (referred to as a trigger frame_C) may be transmitted which controls the next transmission timing of and the frequency resource used for the adjacent AP on the upstream side and specifies the relevant adjacent AP on the upstream side.

Figure 22:
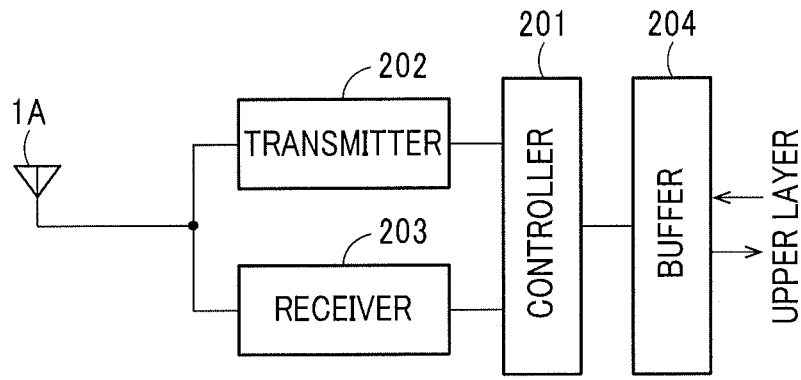
FIG. 22 is a block diagram of a terminal according to the first embodiment.

FIG. 22 is a functional block diagram of the wireless communication device installed in the terminal (non-AP terminal).

The wireless communication device includes a controller 201, a transmitter 202, a receiver 203, at least one antenna 1, and a buffer 204. The controller 201 corresponds to controlling circuitry or a baseband integrated circuit which controls communication with the AP, and the transmitter 202 and the receiver 203 form a wireless communicator or an RF integrated circuit which transmits and receives frames. A process of the controller 201, and all or a part of a digital domain process of the transmitter 202 and the receiver 203 may be performed by software (program) executing on a processor such as a CPU, or may be performed by hardware, or may be performed by the both of the software and the hardware. The terminal may include a processor performing the process of the controller 201, all or a part of the transmitter 202 and the receiver 103.

The buffer 204 is a storage for transferring a frame or data between an upper layer and the controller 201. The buffer 204 may be a volatile memory such as a DRAM or a non-volatile memory such as a NAND, or an MRAM.

The upper layer generates the frames or a payload thereof (such as the data) to be transmitted to other terminals, the AP, or a device on another network such as a server and stores the generated frames in the buffer 204, or takes in, via the buffer 204, the frames or a payload thereof received from other terminals, the AP, or a device on another network such as a server. The upper layer may perform an upper communication process than a MAC layer such as a TCP/IP or a UDP/IP. The TCP/IP or the UDP/IP may be performed in the controller 201 and the upper layer may perform a process of an application layer of processing the data upper than the TCP/IP or the UDP/IP. A process of the upper layer may be performed by software (program) executing on a processor such as a CPU, or may be performed by hardware, or may be performed by the both of these software and hardware.

The controller 201 mainly performs a process of the MAC layer, and a part or all of a process of a physical layer. The controller 201 transmits and receives the frames via the transmitter 202 and the receiver 203 to and from the AP to control the communication with the AP. The controller 201 may include a clock generator generating a clock, and manage an internal time using the clock generated. The controller 201 may output externally the clock created by the clock generator. Additionally, the controller 201 may be configured to receive the clock externally input, and manage an internal time using the clock.

The controller 201, as an example, receives the beacon frame to detect the attribute and synchronization information of BSS of the AP and then transmits an association request to the AP to perform an association process in response to the received beacon. The controller 201 may perform a process such as an authentication process if necessary before transmitting the association request. The controller 201 may transmit the number of antennas included in the terminal of itself as the capability information of the terminal. The capability information may be transmitted, in addition to at the association process, when receiving the acquisition request for the capability information from the AP.

The controller 201 periodically checks the buffer 204 to grasp a state of the buffer 204 such as whether or not the data exists to be transmitted by way of the uplink transmission. Alternatively, the controller 201 checks the state of the buffer 204 by an external trigger such as the buffer 204. Once the controller 201 confirms the existence of the data in the buffer 204, it may transmit, after acquiring the access right to the wireless medium (transmission right) in accordance with the CSMA/CA or the like, the frame containing the relevant data (more specifically, the physical packet having the physical header added thereto) via the transmitter 202 and the antenna 1.

The transmitter 202 subjects the frame input from the controller 201 to DA conversion, a filtering process to extract components of a desired band, frequency conversion (up-conversion) and the like to amplify signals obtained through these processes by a pre-amplifier and radiate the amplified signals as radio waves from one or more antennas into the space. In a case where the plural antennas are included, the frame may be transmitted by way of beam forming.

The signal received by the antenna 1 is processed in the receiver 203. The received signal is amplified in the receiver 203 by the LNA, subjected to frequency conversion (down-conversion) and a filtering process to extract components of the desired band. The extracted signals are further converted into digital signals through AD conversion and output to the controller 201. The controller 201 performs demodulation, error-correcting decode, and a process of the physical header, and the frame such as the data frame are acquired. In the case of the OFDMA, the RU or channel for the device of itself is identified and the signal components of the identified RU or channel are extracted to be subjected to the processes such as demodulation. If a receiver address (Address 1) of the MAC header of the frame matches the MAC address of the terminal of itself, the relevant frame is processed as the frame addressed to the terminal of itself. If not match, the relevant frame is discarded.

The controller 201 carries out the CRC check of the received frame (in a case of the aggregation frame, the CRC check is carried out for the plural subframes in the aggregation frame). The controller 201 transmits the acknowledgement response frame via the transmitter 202 after elapse of a certain time period such as the SIFS from the completion of receiving the frame. If the controller 201 receives the RTS frame from the AP, it transmits, as the acknowledgement response frame with respect to that, the CTS frame. The controller 201 receives a trigger frame from the AP, and in a case where the terminal of itself is specified in the trigger frame, generates and transmits the frame (or the aggregation frame) in accordance with the parameter information set for the terminal of itself (e.g., the frequency resource information such as the RU or channel, the PPDU length information, the frame classification information).

If the controller 201 transmits the frame such as the data frame to the AP, it receives via the receiver 203 the acknowledgement response frame (such as the ACK frame or the BA frame) transmitted from the AP after elapse of a certain time period such as the SIFS from the completion of the transmission. The controller 201 determines whether or not the data frame (or the individual subframes aggregated in the aggregation frame in the case of the aggregation frame transmission) is successfully transmitted on the basis of the acknowledgement response frame.

The controller 201 may access a storage device that stores either information to be notified to the AP or the information notified from the AP or both of these pieces of information and read the information. The storage device may be an internal memory device, an external memory device, a volatile memory device, or a non-volatile memory. Also, the storage devices such as an SSD and a hard disk may be used in place of the memory device.

The above described isolation of the processes of the controller 201 and the transmitter 202 is an example, and another form may be used. For example, the controller 201 may perform the process until the digital domain process and the DA conversion, and the transmitter 202 may perform process subsequent to the DA conversion. As for the isolation of the processes of the controller 201 and the receiver 203, similarly, the receiver 203 may perform the process before the AD conversion and the controller 201 may perform the digital domain process including processes following the AD conversion.

As one example, the baseband integrated circuit in accordance with this embodiment corresponds to the section that carries out the processing of digital domain, the section that carries out the processing of the DA conversion in the transmission, and the section that carries out the processing including and following the AD conversion in the reception. The RF integrated circuit corresponds to the section that carries out the processing following the DA conversion in the transmission and the section that carries out the processing prior to the AD conversion in the reception. The integrated circuit for the wireless communication in accordance with this embodiment includes at least a baseband integrated circuit from the baseband integrated circuit and the RF integrated circuit. The processing processes between blocks or processing processes between the baseband integrated circuit and the RF integrated circuit may be isolated from each other in accordance with any method other than those described herein.

This terminal may include a plurality of antennas each having directivity controllable to control the directivity for the antenna.

Second Embodiment

Figure 23:
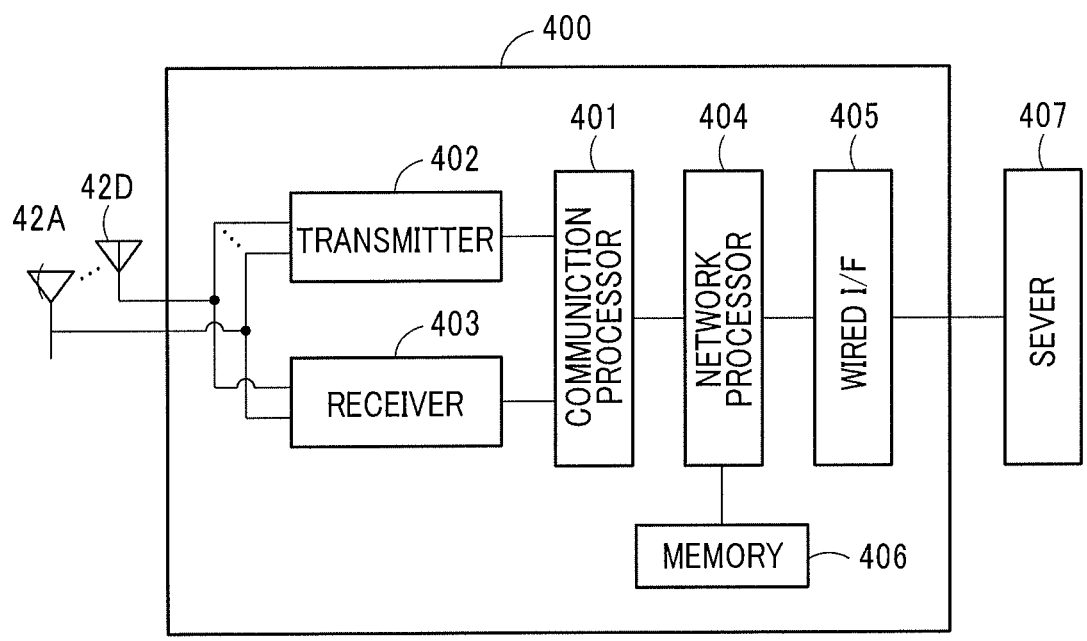
FIG. 23 is a functional block diagram of an access point or terminal according to a second embodiment.

FIG. 23 is a functional block diagram of a base station (access point) 400 according to the second embodiment. The access point includes a communication processor 401, a transmitter 402, a receiver 403, antennas 42A, 42B, 42C, and 42D, a network processor 404, a wired I/F 405, and a memory 406. The access point 400 is connected to a server 407 through the wired I/F 405. At least a former of the communication processor 401 and the network processor 404 has functions similar to the controller in the first embodiment. The transmitter 402 and the receiver 403 have functions similar to the transmitter and the receiver described in the first embodiment. Alternatively, the transmitter 402 and the receiver 403 may perform analog domain processing in the transmitter and the receiver and the network processor 404 may perform digital domain processing in the transmitter and the receiver in the first embodiment. The communication processor 404 has functions similar to the upper layer processor. The communication processor 401 may internally possess a buffer for transferring data to and from the network processor 404. The buffer may be a volatile memory, such as an SRAM or a DRAM, or may be a non-volatile memory, such as a NAND or an MRAM.

The network processor 404 controls data exchange with the communication processor 401, data writing and reading to and from the memory 406, and communication with the server 407 through the wired I/F 405. The network processor 404 may execute a higher communication process of the MAC layer, such as TCP/IP or UDP/IP, or a process of the application layer. The operation of the network processor may be performed through processing of software (program) by a processor, such as a CPU. The operation may be performed by hardware or may be performed by both of the software and the hardware.

For example, the communication processor 401 corresponds to a baseband integrated circuit, and the transmitter 402 and the receiver 403 correspond to an RF integrated circuit that transmits and receives frames. The communication processor 401 and the network processor 404 may be formed by one integrated circuit (one chip). Parts that execute processing of digital areas of the transmitter 402 and the receiver 403 and parts that execute processing of analog areas may be formed by different chips. The communication processor 401 may execute a higher communication process of the MAC layer, such as TCP/IP or UDP/IP. Although the number of antennas is four here, it is only necessary that at least one antenna is included.

The memory 406 saves data received from the server 407 and data received by the receiver 402. The memory 406 may be, for example, a volatile memory, such as a DRAM, or may be a non-volatile memory, such as a NAND or an MRAM. The memory 406 may be an SSD, an HDD, an SD card, an eMMC, or the like. The memory 406 may be provided outside of the base station 400.

The wired I/F 405 transmits and receives data to and from the server 407. Although the communication with the server 407 is performed through a wire in the present embodiment, the communication with the server 407 may be performed wirelessly.

The server 407 is a communication device that returns a response including requested data in response to reception of a data forward request for requesting transmission of the data. Examples of the server 407 include an HTTP server (Web server) and an FTP server. However, the server 407 is not limited to these as long as the server 407 has a function of returning the requested data. The server 407 may be a communication device operated by the user, such as a PC or a smartphone. The server 407 may wirelessly communicate with the base station 400.

When the STA belonging to the BSS of the base station 400 issues a forward request of data for the server 407, a packet regarding the data forward request is transmitted to the base station 400. The base station 400 receives the packet through the antennas 42A to 42D. The base station 400 causes the receiver 403 to execute the process of the physical layer and the like and causes the communication processor 401 to execute the process of the MAC layer and the like.

The network processor 404 analyzes the packet received from the communication processor 401. Specifically, the network processor 404 checks the destination IP address, the destination port number, and the like. When the data of the packet is a data forward request such as an HTTP GET request, the network processor 404 checks whether the data requested by the data forward request (for example, data in the URL requested by the HTTP GET request) is cached (stored) in the memory 406. A table associating the URL (or reduced expression of the URL, such as a hash value or an identifier substituting the URL) and the data is stored in the memory 406. The fact that the data is cached in the memory 406 will be expressed that the cache data exists in the memory 406.

When the cache data does not exist in the memory 406, the network processor 404 transmits the data forward request to the server 407 through the wired I/F 405. In other words, the network processor 404 substitutes the STA to transmit the data forward request to the server 407. Specifically, the network processor 404 generates an HTTP request and executes protocol processing, such as adding the TCP/IP header, to transfer the packet to the wired I/F 405. The wired I/F 405 transmits the received packet to the server 407.

The wired I/F 405 receives, from the server 407, a packet that is a response to the data forward request. From the IP header of the packet received through the wired I/F 405, the network processor 404 figures out that the packet is addressed to the STA and transfers the packet to the communication processor 401. The communication processor 401 executes processing of the MAC layer and the like for the packet. The transmitter 402 executes processing of the physical layer and the like and transmits the packet addressed to the STA from the antennas 42A to 42D. The network processor 404 associates the data received from the server 407 with the URL (or reduced expression of the URL) and saves the cache data in the memory 406.

When the cache data exists in the memory 406, the network processor 404 reads the data requested by the data forward request from the memory 406 and transmits the data to the communication processor 401. Specifically, the network processor 404 adds the HTTP header or the like to the data read from the memory 406 and executes protocol processing, such as adding the TCP/IP header, to transmit the packet to the communication processor 401. In this case, the transmitter IP address of the packet is set to the same IP address as the server, and the transmitter port number is also set to the same port number as the server (destination port number of the packet transmitted by the communication terminal), for example. Therefore, it can be viewed from the STA as if communication with the server 407 is established. The communication processor 401 executes processing of the MAC layer and the like for the packet. The transmitter 402 executes processing of the physical layer and the like and transmits the packet addressed to the STA from the antennas 42A to 42D.

According to the operation, frequently accessed data is responded based on the cache data saved in the memory 406, and the traffic between the server 407 and the base station 400 can be reduced. Note that the operation of the network processor 404 is not limited to the operation of the present embodiment. There is no problem in performing other operation when a general caching proxy is used, in which data is acquired from the server 407 in place of the STA, the data is cached in the memory 406, and a response is made from the cache data of the memory 406 for a data forward request of the same data.

The base station (access point) according to the present invention can be applied for the base station in the above-stated any embodiment. The transmission of the frame, the data or the packet used in the any embodiment may be carried out based on the cached data stored in the memory 406. Also, information obtained based on the frame, the data or the packet received by the base station in the first to seventh embodiments may be cached in the memory 406. The frame transmitted by the base station in the first to seventh embodiments may include the cached data or information based on the cached data. The information based on the cached data may include information on a size of the data, a size of a packet required for transmission of the data. The information based on the cached data may include a modulation scheme required for transmission of the data. The information based on the cached data may include information on existence or non-existence of data addressed to the terminal, The base station (access point) according to the present invention can be applied for the base station in the above-stated any embodiment. In the present embodiment, although the base station with the cache function is described, a terminal (STA) with the cache function can also be realized by the same block configuration as FIG. 23. In this case, the wired I/F 405 may be omitted. The transmission, by the terminal, of the frame, the data or the packet used in the any embodiment may be carried out based on the cached data stored in the memory 406. Also, information obtained based on the frame, the data or the packet received by the terminal in the any embodiment may be cached in the memory 406. The frame transmitted by the terminal in the first embodiment may include the cached data or information based on the cached data. The information based on the cached data may include information on a size of the data, a size of a packet required for transmission of the data. The information based on the cached data may include a modulation scheme required for transmission of the data. The information based on the cached data may include information on existence or non-existence of data addressed to the terminal.

Third Embodiment

Figure 24:
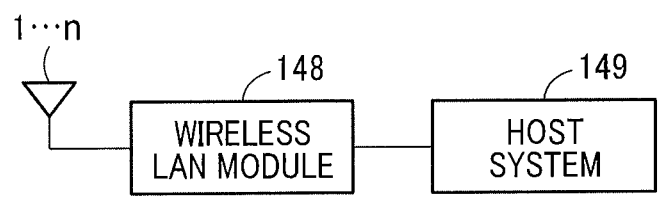
FIG. 24 is a diagram showing an exemplary entire configuration of a terminal or access point according to a third embodiment.

FIG. 24 shows an example of entire configuration of a terminal (WLAN terminal) or a base station. The example of configuration is just an example, and the present embodiment is not limited to this. The terminal or the base station includes one or a plurality of antennas 1 to n (n is an integer equal to or greater than 1), a wireless LAN module 148, and a host system 149. The wireless LAN module 148 corresponds to the wireless communication device according to the first embodiment. The wireless LAN module 148 includes a host interface and is connected to the host system 149 through the host interface. Other than the connection to the host system 149 through the connection cable, the wireless LAN module 148 may be directly connected to the host system 149. The wireless LAN module 148 can be mounted on a substrate by soldering or the like and can be connected to the host system 149 through wiring of the substrate. The host system 149 uses the wireless LAN module 148 and the antennas 1 to n to communicate with external apparatuses according to an arbitrary communication protocol. The communication protocol may include the TCP/IP and a protocol of a layer higher than that. Alternatively, the TCP/IP may be mounted on the wireless LAN module 148, and the host system 149 may execute only a protocol in a layer higher than that. In this case, the configuration of the host system 149 can be simplified. Examples of the present terminal include a mobile terminal, a TV, a digital camera, a wearable device, a tablet, a smartphone, a game device, a network storage device, a monitor, a digital audio player, a Web camera, a video camera, a projector, a navigation system, an external adaptor, an internal adaptor, a set top box, a gateway, a printer server, a mobile access point, a router, an enterprise/service provider access point, a portable device, a hand-held device, a vehicle and so on.

The wireless LAN module 148 (or the wireless communication device) may have functions of other wireless communication standards such as LTE (Long Term Evolution), LTE-Advanced (standards for mobile phones) as well as the IEEE802.11.

Figure 25:
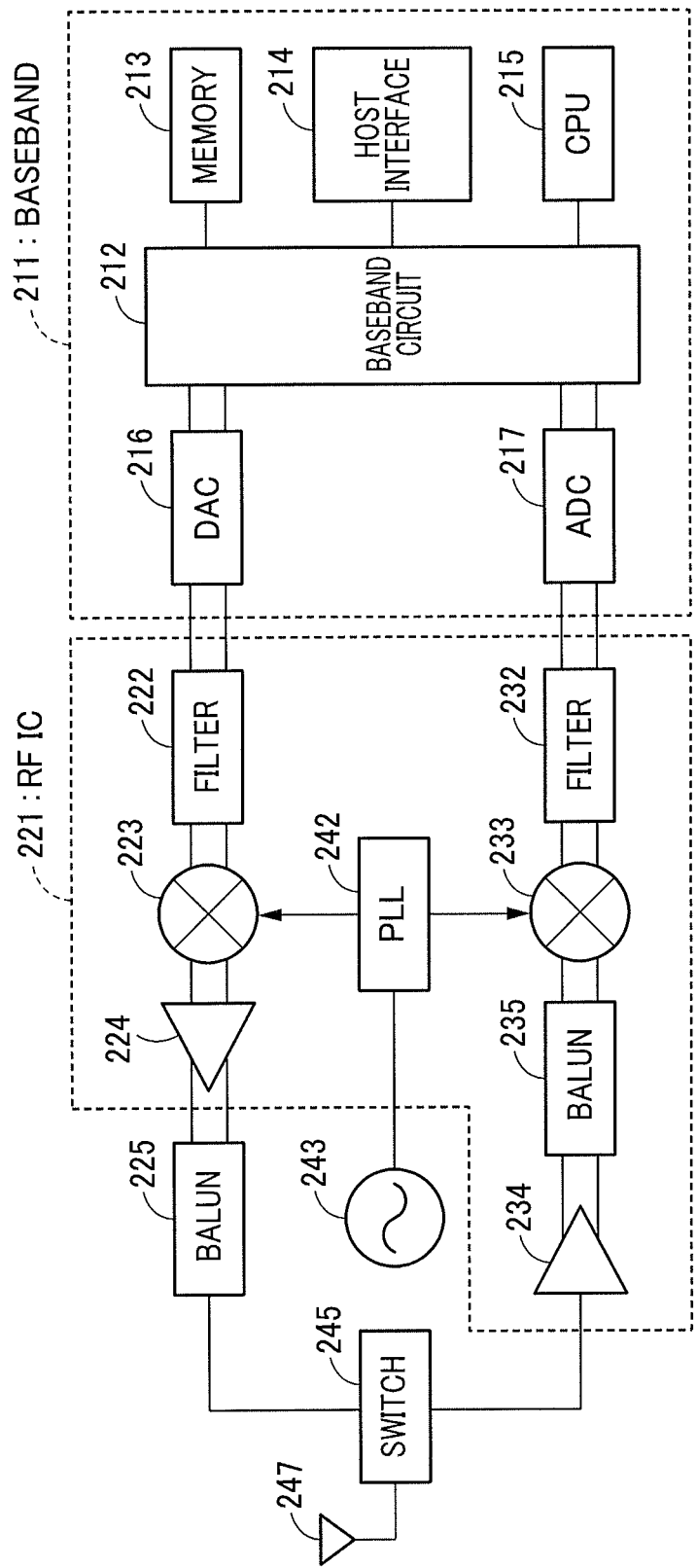
FIG. 25 is a diagram showing an exemplary hardware configuration of a wireless communication device equipped in the access point or terminal according to the third embodiment.

FIG. 25 shows an example of hardware configuration of a WLAN module. The configuration shown in the figure may be applied for each case in where the wireless communication device is mounted in non-AP terminal or in AP (Access Point) provided correspondingly to each function. That is, the configuration can be applied as specific examples of the wireless communication device as described in the above-stated any embodiment. In the configuration shown in figure, at least one antenna 247 is included although a plurality of antennas are included. In this case, a plurality of sets of a transmission system (216 and 222 to 225), a reception system (217, 232 to 235), a PLL 242, a crystal oscillator (reference signal source) 243, and a switch 245 may be arranged according to the antennas, and each set may be connected to a control circuit 212. One or both of the PLL 242 and the crystal oscillator 243 correspond to an oscillator according to the present embodiment.

The wireless LAN module (wireless communication device) includes a baseband IC (Integrated Circuit) 211, an RF (Radio Frequency) IC 221, a balun 225, the switch 245, and the antenna 247.

The baseband IC 211 includes the baseband circuit (control circuit) 212, a memory 213, a host interface 214, a CPU 215, a DAC (Digital to Analog Converter) 216, and an ADC (Analog to Digital Converter) 217.

The baseband IC 211 and the RF IC 221 may be formed on the same substrate. The baseband IC 211 and the RF IC 221 may be formed by one chip. Both or one of the DAC 216 and the ADC 217 may be arranged on the RF IC 221 or may be arranged on another IC. Both or one of the memory 213 and the CPU 215 may be arranged on an IC other than the baseband IC.

The memory 213 stores data to be transferred to and from the host system. The memory 213 also stores one or both of information to be transmitted to the terminal or the base station and information transmitted from the terminal or the base station. The memory 213 may also store a program necessary for the execution of the CPU 215 and may be used as a work area for the CPU 215 to execute the program. The memory 213 may be a volatile memory, such as an SRAM or a DRAM, or may be a non-volatile memory, such as a NAND or an MRAM.

The host interface 214 is an interface for connection to the host system. The interface can be anything, such as UART, SPI, SDIO, USB, or PCI Express.

The CPU 215 is a processor that executes a program to control the baseband circuit 212. The baseband circuit 212 mainly executes a process of the MAC layer and a process of the physical layer. One or both of the baseband circuit 212 and the CPU 215 correspond to the communication control apparatus that controls communication, the controller that controls communication, or controlling circuitry that controls communication.

At least one of the baseband circuit 212 or the CPU 215 may include a clock generator that generates a clock and may manage internal time by the clock generated by the clock generator.

For the process of the physical layer, the baseband circuit 212 performs addition of the physical header, coding, encryption, modulation process (which may include MIMO modulation), and the like of the frame to be transmitted and generates, for example, two types of digital baseband signals (hereinafter, "digital I signal" and "digital Q signal").

The DAC 216 performs DA conversion of signals input from the baseband circuit 212. More specifically, the DAC 216 converts the digital I signal to an analog I signal and converts the digital Q signal to an analog Q signal. Note that a single system signal may be transmitted without performing quadrature modulation. When a plurality of antennas are included, and single system or multi-system transmission signals equivalent to the number of antennas are to be distributed and transmitted, the number of provided DACs and the like may correspond to the number of antennas.

The RF IC 221 is, for example, one or both of an RF analog IC and a high frequency IC. The RF IC 221 includes a filter 222, a mixer 223, a preamplifier (PA) 224, the PLL (Phase Locked Loop) 242, a low noise amplifier (LNA) 234, a balun 235, a mixer 233, and a filter 232. Some of the elements may be arranged on the baseband IC 211 or another IC. The filters 222 and 232 may be bandpass filters or low pass filters.

The filter 222 extracts a signal of a desired band from each of the analog I signal and the analog Q signal input from the DAC 216. The PLL 242 uses an oscillation signal input from the crystal oscillator 243 and performs one or both of division and multiplication of the oscillation signal to thereby generate a signal at a certain frequency synchronized with the phase of the input signal. Note that the PLL 242 includes a VCO (Voltage Controlled Oscillator) and uses the VCO to perform feedback control based on the oscillation signal input from the crystal oscillator 243 to thereby obtain the signal at the certain frequency. The generated signal at the certain frequency is input to the mixer 223 and the mixer 233. The PLL 242 is equivalent to an example of an oscillator that generates a signal at a certain frequency.

The mixer 223 uses the signal at the certain frequency supplied from the PLL 242 to up-convert the analog I signal and the analog Q signal passed through the filter 222 into a radio frequency. The preamplifier (PA) amplifies the analog I signal and the analog Q signal at the radio frequency generated by the mixer 223, up to desired output power. The balun 225 is a converter for converting a balanced signal (differential signal) to an unbalanced signal (single-ended signal). Although the balanced signal is handled by the RF IC 221, the unbalanced signal is handled from the output of the RF IC 221 to the antenna 247. Therefore, the balun 225 performs the signal conversions.

The switch 245 is connected to the balun 225 on the transmission side during the transmission and is connected to the LNA 234 or the RF IC 221 on the reception side during the reception. The baseband IC 211 or the RF IC 221 may control the switch 245. There may be another circuit that controls the switch 245, and the circuit may control the switch 245.

The analog I signal and the analog Q signal at the radio frequency amplified by the preamplifier 224 are subjected to balanced-unbalanced conversion by the balun 225 and are then emitted as radio waves to the space from the antenna 247.

The antenna 247 may be a chip antenna, may be an antenna formed by wiring on a printed circuit board, or may be an antenna formed by using a linear conductive element.

The LNA 234 in the RF IC 221 amplifies a signal received from the antenna 247 through the switch 245 up to a level that allows demodulation, while maintaining the noise low.

The balun 235 performs unbalanced-balanced conversion of the signal amplified by the low noise amplifier (LNA) 234. The mixer 233 uses the signal at the certain frequency input from the PLL 242 to down-convert, to a baseband, the reception signal converted to a balanced signal by the balun 235. More specifically, the mixer 233 includes a unit that generates carrier waves shifted by a phase of 90 degrees based on the signal at the certain frequency input from the PLL 242. The mixer 233 uses the carrier waves shifted by a phase of 90 degrees to perform quadrature demodulation of the reception signal converted by the balun 235 and generates an I (In-phase) signal with the same phase as the reception signal and a Q (Quad-phase) signal with the phase delayed by 90 degrees. The filter 232 extracts signals with desired frequency components from the I signal and the Q signal. Gains of the I signal and the Q signal extracted by the filter 232 are adjusted, and the I signal and the Q signal are output from the RF IC 221.

The ADC 217 in the baseband IC 211 performs AD conversion of the input signal from the RF IC 221. More specifically, the ADC 217 converts the I signal to a digital I signal and converts the Q signal to a digital Q signal. Note that a single system signal may be received without performing quadrature demodulation.

When a plurality of antennas are provided, the number of provided ADCs may correspond to the number of antennas. Based on the digital I signal and the digital Q signal, the baseband circuit 212 executes a process of the physical layer and the like, such as demodulation process, error correcting code process, and process of physical header, and obtains a frame. The baseband circuit 212 applies a process of the MAC layer to the frame. Note that the baseband circuit 212 may be configured to execute a process of TCP/IP when the TCP/IP is implemented.

The antenna 247 may be a directivity variable antenna. In this case, switching control of directivity patterns may be carried out in the baseband circuit 212 or CPU 215 or the like.

Fourth Embodiment

Figure 26:
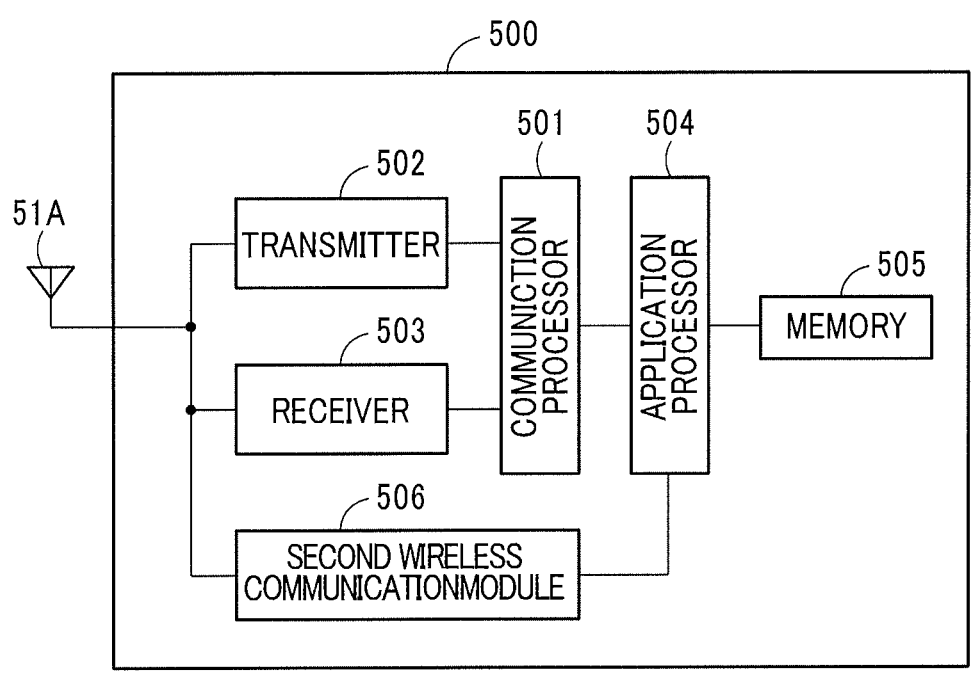
FIG. 26 is a functional block diagram of an access point or terminal according to a fourth embodiment.

FIG. 26 is a functional block diagram of the terminal (STA) 500 according to a fourth embodiment. The STA 500 includes a communication processor 501, a transmitter 502, a receiver 503, an antenna 51A, an application processor 504, a memory 505, and a second wireless communication module 506. The base station (AP) may have the similar configuration.

The communication processor 501 has the functions similar to the controller as described in the first embodiment. The transmitter 502 and the receiver 503 have the functions similar to the transmitter and the receiver as described in the first embodiment. The transmitter 502 and the receiver 503 may perform analog domain processing in the transmitter and the receiver as described in the first embodiment and the communication processor 501 may perform digital domain processing in the transmitter and the receiver as described in the first embodiment. The communication processor 501 may internally possess a buffer for transferring data to and from the application processor 504. The buffer may be a volatile memory, such as an SRAM or a DRAM, or may be a non-volatile memory, such as a NAND or an MRAM.

The application processor 504 performs wireless communication through the communication processor 501, data writing or reading with the memory 505 and wireless communication through the second wireless communication module 506. The application processor 504 performs various processing such as Web browsing or multimedia processing of video or music or the like. The operation of application processor 504 may be carried out by software (program) processing by a processor such as CPU, by hardware, or both of them.

The memory 505 saves data received at the receiver 503 or the second wireless communication module 506, or data processed by the application processor 504. The memory 505 may be a volatile memory such as a DRAM or may be a non-volatile memory, such as a NAND or an MRAM. The memory 505 may be an SSD, an HDD, an SD card, or an eMMC or the like. The memory 505 may be arranged out of the access point 500.

The second wireless communication module 506 have the similar configuration to the WLAN module as shown in FIG. 24 or FIG. 25 as one example. The second wireless communication module 506 performs wireless communication in a different manner than that realized by the communication processor 501, the transmitter 502 and the receiver 503. For example, in a case that the communication processor 501, the transmitter 502 and the receiver 503 perform wireless communication in compliance with IEEE802.11 standard, the second wireless communication module 506 may perform wireless communication in compliance with another wireless communication standard such as Bluetooth (trademark), LTE, Wireless HD or the like. The communication processor 501, the transmitter 502, the receiver 503 may perform wireless communication at 2.4 GHz/5 GHz and the second wireless communication module 506 may perform wireless communication at 60 GHz.

In the embodiment, one antenna is arranged and shared by the transmitter 502, the receiver 503 and the second wireless communication module 506. A switch controlling for connection destination of the antenna 51A may be arranged and thereby the antenna may be shared. A plurality of antennas may be arranged and may be employed by the transmitter 502, the receiver 503, and the second wireless communication module 506, respectively.

As one example, the communication processor 501 corresponds to an integrated circuit, and the transmitter 502 and the receiver 503 corresponds to an RF integrated circuit which transmits and receives frames. A set of the communication processor 501 and the application processor 504 is configured by one integrated circuit (1 chip). A part of the second wireless communication module 506 and the application processor 504 may be configured by one integrated circuit (1 chip).

The application processor performs control of wireless communication through the communication processor 501 and wireless communication through the second wireless communication module 506.

Fifth Embodiment

Figure 27A:
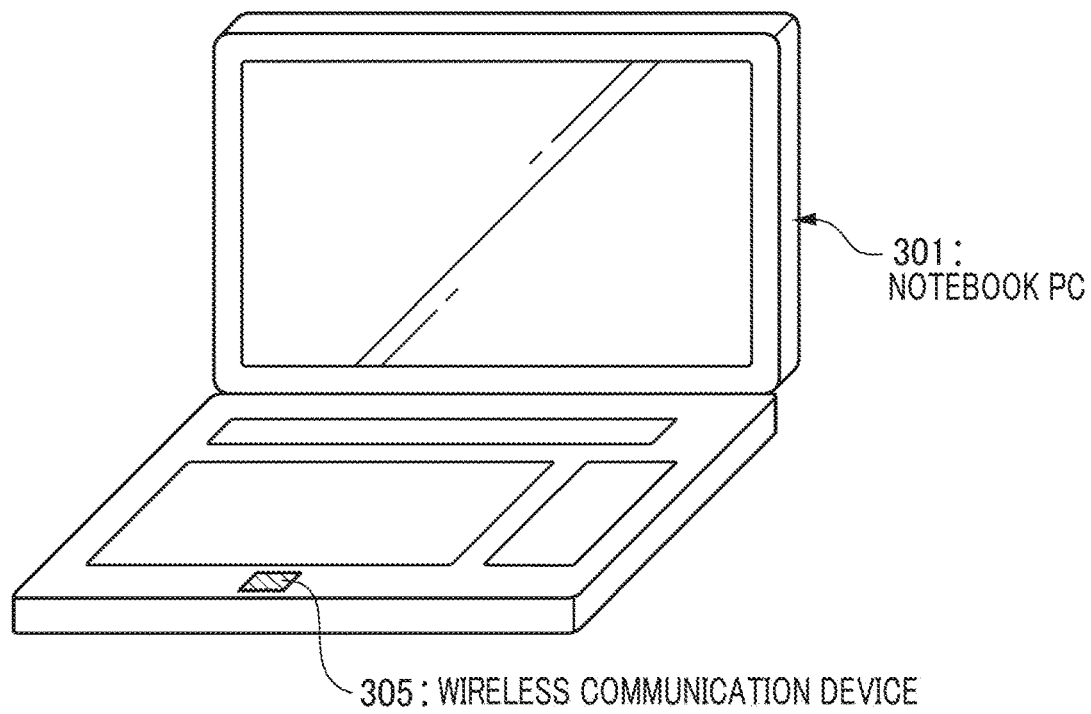
FIGS. 27A and 27B each shows a perspective view of a terminal according to a fifth embodiment.
Figure 27B:
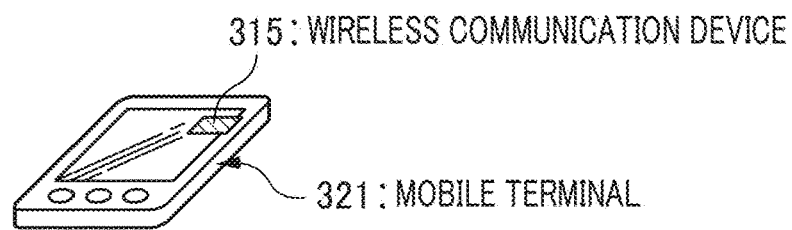

FIG. 27A and FIG. 27B are perspective views of wireless terminal according to the third embodiment. The wireless terminal in FIG. 27A is a notebook PC 301 and the wireless communication device (or a wireless device) in FIG. 27B is a mobile terminal 321. Each of them corresponds to one form of a terminal (which may indicate a base station). The notebook PC 301 and the mobile terminal 321 are equipped with wireless communication devices 305 and 315, respectively. The wireless communication device provided in a terminal (which may indicate a base station) which has been described above can be used as the wireless communication devices 305 and 315. A wireless terminal carrying a wireless communication device is not limited to notebook PCs and mobile terminals. For example, it can be installed in a TV, a digital camera, a wearable device, a tablet, a smart phone, a gaming device, a network storage device, a monitor, a digital audio player, a web camera, a video camera, a projector, a navigation system, an external adapter, an internal adapter, a set top box, a gateway, a printer server, a mobile access point, a router, an enterprise/service provider access point, a portable device, a handheld device, a vehicle and so on.

Figure 28:
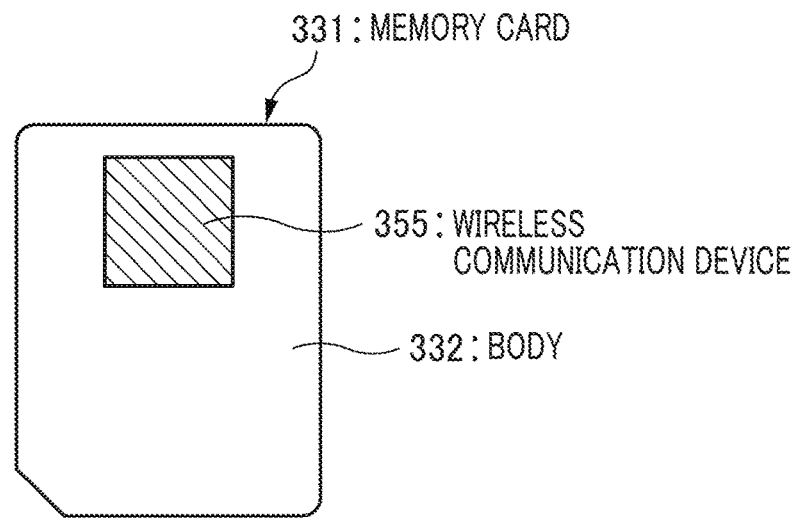
FIG. 28 is a diagram showing a memory card according to the fifth embodiment.

Moreover, a wireless communication device installed in a terminal (which may indicate a base station) can also be provided in a memory card. FIG. 28 illustrates an example of a wireless communication device mounted on a memory card. A memory card 331 contains a wireless communication device 355 and a body case 332. The memory card 331 uses the wireless communication device 355 for wireless communication with external devices. Here, in FIG. 28, the description of other installed elements (for example, a memory, and so on) in the memory card 331 is omitted.

Sixth Embodiment

In the present embodiment, a bus, a processor unit and an external interface unit are provided in addition to the configuration of the wireless communication device (the wireless communication device of the terminal (which may indicate the base station)) according to any of the above embodiments. The processor unit and the external interface unit are connected with an external memory (a buffer) unit through the bus. A firmware operates the processor unit. Thus, by adopting a configuration in which the firmware is included in the wireless communication device, the functions of the wireless communication device can be easily changed by rewriting the firmware. The processing unit in which the firmware operates may be a processor that performs the process of the communication controlling device or the control unit according to the present embodiment, or may be another processor that performs a process relating to extending or altering the functions of the process of the communication controlling device or the control unit. The processing unit in which the firmware operates may be included in the access point or the wireless terminal according to the present embodiment. Alternatively, the processing unit may be included in the integrated circuit of the wireless communication device installed in the access point, or in the integrated circuit of the wireless communication device installed in the wireless terminal.

Seventh Embodiment

In the present embodiment, a clock generating unit is provided in addition to the configuration of the wireless communication device (the wireless communication device of the terminal (which may indicate the base station)) according to any of the above embodiments. The clock generating unit generates a clock and outputs the clock from an output terminal to the exterior of the wireless communication device. Thus, by outputting to the exterior the clock generated inside the wireless communication device and operating the host by the clock output to the exterior, it is possible to operate the host and the wireless communication device in a synchronized manner.

Eighth Embodiment

In the present embodiment, a power source unit, a power source controlling unit and a wireless power feeding unit are included in addition to the configuration of the wireless communication device (the wireless communication device of the terminal (which may indicate the base station)) according to any of the above embodiments. The power supply controlling unit is connected to the power source unit and to the wireless power feeding unit, and performs control to select a power source to be supplied to the wireless communication device. Thus, by adopting a configuration in which the power source is included in the wireless communication device, power consumption reduction operations that control the power source are possible.

Ninth Embodiment

In the present embodiment, a SIM card is added to the configuration of the wireless communication device according to any of the above embodiments. For example, the SIM card is connected with the controller, the transmitter, the receiver or plural of them in the wireless communication device. Thus, by adopting a configuration in which the SIM card is included in the wireless communication device, authentication processing can be easily performed.

Tenth Embodiment

In the eighth embodiment, a video image compressing/decompressing unit is added to the configuration of the wireless communication device according to any of the above embodiments. The video image compressing/decompressing unit is connected to the bus. Thus, by adopting a configuration in which the video image compressing/decompressing unit is included in the wireless communication device, transmitting a compressed video image and decompressing a received compressed video image can be easily done.

Eleventh Embodiment

In the present embodiment, an LED unit is added to the configuration of the wireless communication device (the wireless communication device of the terminal (which may indicate the base station)) according to any of the above embodiments. For example, the LED unit is connected to the controller, the transmitter, the receiver or plural of them in the wireless communication device. Thus, by adopting a configuration in which the LED unit is included in the wireless communication device, notifying the operation state of the wireless communication device to the user can be easily done.

Twelfth Embodiment

In the present embodiment, a vibrator unit is included in addition to the configuration of the wireless communication device wireless communication device (the wireless communication device of the terminal (which may indicate the base station)) according to any of the above embodiments. For example, the vibrator unit is connected to at least one of the controller, the transmitter, the receiver or plural of them in the wireless communication device. Thus, by adopting a configuration in which the vibrator unit is included in the wireless communication device, notifying the operation state of the wireless communication device to the user can be easily done.

Thirteenth Embodiment

In the present embodiment, the configuration of the wireless communication device includes a display in addition to the configuration of the wireless communication device (the wireless communication device of the terminal (which may indicate the base station)) according to any one of the above embodiments. The display may be connected to the controller, the transmitter, the receiver or plural of them in the wireless communication device via a bus (not shown). As seen from the above, the configuration including the display to display the operation state of the wireless communication device on the display allows the operation status of the wireless communication device to be easily notified to a user.

Fourteenth Embodiment

In the present embodiment, [1] the frame type in the wireless communication system, [2] a technique of disconnection between wireless communication devices, [3] an access scheme of a wireless LAN system and [4] a frame interval of a wireless LAN are described.

[1] Frame Type in Communication System

Generally, as mentioned above, frames treated on a wireless access protocol in a wireless communication system are roughly divided into three types of the data frame, the management frame and the control frame. These types are normally shown in a header part which is commonly provided to frames. As a display method of the frame type, three types may be distinguished in one field or may be distinguished by a combination of two fields. In IEEE 802.11 standard, identification of a frame type is made based on two fields of Type and Subtype in the Frame Control field in the header part of the MAC frame. The Type field is one for generally classifying frames into a data frame, a management frame, or a control frame and the Subtype field is one for identifying more detailed type in each of the classified frame types such as a beacon frame belonging to the management frame.

The management frame is a frame used to manage a physical communication link with a different wireless communication device. For example, there are a frame used to perform communication setting with the different wireless communication device or a frame to release communication link (that is, to disconnect the connection), and a frame related to the power save operation in the wireless communication device.

The data frame is a frame to transmit data generated in the wireless communication device to the different wireless communication device after a physical communication link with the different wireless communication device is established. The data is generated in a higher layer of the present embodiment and generated by, for example, a user's operation.

The control frame is a frame used to perform control at the time of transmission and reception (exchange) of the data frame with the different wireless communication device. A response frame transmitted for the acknowledgment in a case where the wireless communication device receives the data frame or the management frame, belongs to the control frame. The response frame is, for example, an ACK frame or a BlockACK frame. The RTS frame and the CTS frame are also the control frame.

These three types of frames are subjected to processing based on the necessity in the physical layer and then transmitted as physical packets via an antenna. In IEEE 802.11 standard (including the extended standard such as IEEE Std 802.11ac-2013), an association process is defined as one procedure for connection establishment. The association request frame and the association response frame which are used in the procedure are a management frame. Since the association request frame and the association response frame is the management frame transmitted in a unicast scheme, the frames causes the wireless communication terminal in the receiving side to transmit an ACK frame being a response frame. The ACK frame is a control frame as described in the above.

[2] Technique of Disconnection Between Wireless Communication Devices

For disconnection of the connection (release), there are an explicit technique and an implicit technique. As the explicit technique, a frame to disconnect any one of the connected wireless communication devices is transmitted. This frame corresponds to Deauthentication frame defined in IEEE 802.11 standard and is classified into the management frame. Normally, it is determined that the connection is disconnected at the timing of transmitting the frame to disconnect the connection in a wireless communication device on the side to transmit the frame and at the timing of receiving the frame to disconnect the connection in a wireless communication device on the side to receive the frame. Afterward, it returns to the initial state in a communication phase, for example, a state to search for a wireless communication device of the communicating partner. In a case that the wireless communication base station disconnects with a wireless communication terminal, for example, the base station deletes information on the wireless communication device from a connection management table if the base station holds the connection management table for managing wireless communication terminals which entries into the BSS of the base station-self. For example, in a case that the base station assigns an AID to each wireless communication terminal which entries into the BSS at the time when the base station permitted each wireless communication terminal to connect to the base station-self in the association process, the base station deletes the held information related to the AID of the wireless communication terminal disconnected with the base station and may release the AID to assign it to another wireless communication device which newly entries into the BSS.

On the other hand, as the implicit technique, it is determined that the connection state is disconnected in a case where frame transmission (transmission of a data frame and management frame or transmission of a response frame with respect to a frame transmitted by the subject device) is not detected from a wireless communication device of the connection partner which has established the connection for a certain period. Such a technique is provided because, in a state where it is determined that the connection is disconnected as mentioned above, a state is considered where the physical wireless link cannot be secured, for example, the communication distance to the wireless communication device of the connection destination is separated and the radio signals cannot be received or decoded. That is, it is because the reception of the frame to disconnect the connection cannot be expected.

As a specific example to determine the disconnection of connection in an implicit method, a timer is used. For example, at the time of transmitting a data frame that requests an acknowledgment response frame, a first timer (for example, a retransmission timer for a data frame) that limits the retransmission period of the frame is activated, and, if the acknowledgement response frame to the frame is not received until the expiration of the first timer (that is, until a desired retransmission period passes), retransmission is performed. When the acknowledgment response frame to the frame is received, the first timer is stopped.

On the other hand, when the acknowledgment response frame is not received and the first timer expires, for example, a management frame to confirm whether a wireless communication device of a connection partner is still present (in a communication range) (in other words, whether a wireless link is secured) is transmitted, and, at the same time, a second timer (for example, a retransmission timer for the management frame) to limit the retransmission period of the frame is activated. Similarly to the first timer, even in the second timer, retransmission is performed if an acknowledgment response frame to the frame is not received until the second timer expires, and it is determined that the connection is disconnected when the second timer expires.

Alternatively, a third timer is activated when a frame is received from a wireless communication device of the connection partner, the third timer is stopped every time the frame is newly received from the wireless communication device of the connection partner, and it is activated from the initial value again. When the third timer expires, similarly to the above, a management frame to confirm whether the wireless communication device of the connection party is still present (in a communication range) (in other words, whether a wireless link is secured) is transmitted, and, at the same time, a second timer (for example, a retransmission timer for the management frame) to limit the retransmission period of the frame is activated. Even in this case, retransmission is performed if an acknowledgment response frame to the frame is not received until the second timer expires, and it is determined that the connection is disconnected when the second timer expires. The latter management frame to confirm whether the wireless communication device of the connection partner is still present may differ from the management frame in the former case. Moreover, regarding the timer to limit the retransmission of the management frame in the latter case, although the same one as that in the former case is used as the second timer, a different timer may be used.

[3] Access Scheme of Wireless LAN System

For example, there is a wireless LAN system with an assumption of communication or competition with a plurality of wireless communication devices. CSMA/CA is set as the basis of an access scheme in IEEE802.11 (including an extension standard or the like) wireless LAN. In a scheme in which transmission by a certain wireless communication device is grasped and transmission is performed after a fixed time from the transmission end, simultaneous transmission is performed in the plurality of wireless communication devices that grasp the transmission by the wireless communication device, and, as a result, radio signals collide and frame transmission fails. By grasping the transmission by the certain wireless communication device and waiting for a random time from the transmission end, transmission by the plurality of wireless communication devices that grasp the transmission by the wireless communication device stochastically disperses. Therefore, if the number of wireless communication devices in which the earliest time in a random time is subtracted is one, frame transmission by the wireless communication device succeeds and it is possible to prevent frame collision. Since the acquisition of the transmission right based on the random value becomes impartial between the plurality of wireless communication devices, it can say that a scheme adopting Collision Avoidance is a suitable scheme to share a radio medium between the plurality of wireless communication devices.

[4] Frame interval of wireless LAN

The frame interval of IEEE802.11 wireless LAN is described. There are several types of frame intervals used in IEEE802.11 wireless LAN, such as distributed coordination function interframe space (DIFS), arbitration interframe space (AIFS), point coordination function interframe space (PIFS), short interframe space (SIFS), extended interframe space (EIFS) and reduced interframe space (RIFS).

The definition of the frame interval is defined as a continuous period that should confirm and open the carrier sensing idle before transmission in IEEE802.11 wireless LAN, and a strict period from a previous frame is not discussed. Therefore, the definition is followed in the explanation of IEEE802.11 wireless LAN system. In IEEE802.11 wireless LAN, a waiting time at the time of random access based on CSMA/CA is assumed to be the sum of a fixed time and a random time, and it can say that such a definition is made to clarify the fixed time.

DIFS and AIFS are frame intervals used when trying the frame exchange start in a contention period that competes with other wireless communication devices on the basis of CSMA/CA. DIFS is used in a case where priority according to the traffic type is not distinguished, AIFS is used in a case where priority by traffic identifier (TID) is provided.

Since operation is similar between DIFS and AIFS, an explanation below will mainly use AIFS. In IEEE802.11 wireless LAN, access control including the start of frame exchange in the MAC layer is performed. In addition, in a case where QoS (Quality of Service) is supported when data is transferred from a higher layer, the traffic type is notified together with the data, and the data is classified for the priority at the time of access on the basis of the traffic type. The class at the time of this access is referred to as "access category (AC)". Therefore, the value of AIFS is provided every access category.

PIFS denotes a frame interval to enable access which is more preferential than other competing wireless communication devices, and the period is shorter than the values of DIFS and AIFS. SIFS denotes a frame interval which can be used in a case where frame exchange continues in a burst manner at the time of transmission of a control frame of a response system or after the access right is acquired once. EIFS denotes a frame interval caused when frame reception fails (when the received frame is determined to be error).

RIFS denotes a frame interval which can be used in a case where a plurality of frames are consecutively transmitted to the same wireless communication device in a burst manner after the access right is acquired once, and a response frame from a wireless communication device of the transmission partner is not requested while RIFS is used.

Figure 29:
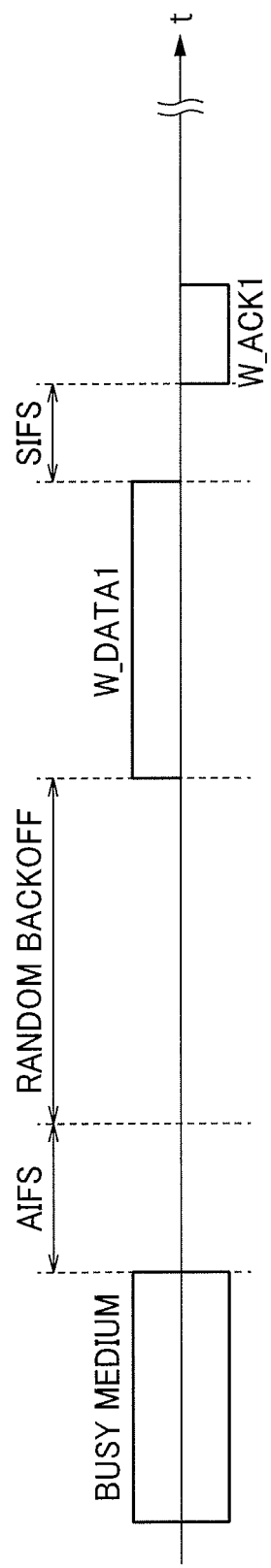
FIG. 29 is a diagram showing an example of frame exchange during a contention period.

Here, FIG. 29 illustrates one example of frame exchange in a competitive period based on the random access in IEEE802.11 wireless LAN.

When a transmission request of a data frame (W_DATA1) is generated in a certain wireless communication device, a case is assumed where it is recognized that a medium is busy (busy medium) as a result of carrier sensing. In this case, AIFS of a fixed time is set from the time point at which the carrier sensing becomes idle, and, when a random time (random backoff) is set afterward, data frame W_DATA1 is transmitted to the communicating partner.

The random time is acquired by multiplying a slot time by a pseudorandom integer led from uniform distribution between contention windows (CW) given by integers from 0. Here, what multiplies CW by the slot time is referred to as "CW time width". The initial value of CW is given by CWmin, and the value of CW is increased up to CWmax every retransmission. Similarly to AIFS, both CWmin and CWmax have values every access category. In a wireless communication device of transmission destination of W_DATA1, when reception of the data frame succeeds, a response frame (W_ACK1) is transmitted after SIFS from the reception end time point. If it is within a transmission burst time limit when W_ACK1 is received, the wireless communication device that transmits W_DATA1 can transmit the next frame (for example, W_DATA2) after SIFS.

Although AIFS, DIFS, PIFS and EIFS are functions between SIFS and the slot-time, SIFS and the slot time are defined every physical layer. Moreover, although parameters whose values being set according to each access category, such as AIFS, CWmin and CWmax, can be set independently by a communication group (which is a basic service set (BSS) in IEEE802.11 wireless LAN), the default values are defined.

For example, in the definition of 802.11ac, with an assumption that SIFS is 16 μs and the slot time is 9 μs, and thereby PIFS is 25 μs, DIFS is 34 μs, the default value of the frame interval of an access category of BACKGROUND (AC_BK) in AIFS is 79 μs, the default value of the frame interval of BEST EFFORT (AC_BE) is 43 μs, the default value of the frame interval between VIDEO(AC_VI) and VOICE(AC_VO) is 34 μs, and the default values of CWmin and CWmax are 31 and 1023 in AC_BK and AC_BE, 15 and 31 in AC_VI and 7 and 15 in AC_VO. Here, EIFS denotes the sum of SIFS, DIFS, and the time length of a response frame transmitted at the lowest mandatory physical rate. In the wireless communication device which can effectively takes EIFS, it may estimate an occupation time length of a PHY packet conveying a response frame directed to a PHY packet due to which the EIFS is caused and calculates a sum of SIFS, DIFS and the estimated time to take the EIFS.

Note that the frames described in the embodiments may indicate not only things called frames in, for example, IEEE 802.11 standard, but also things called packets, such as Null Data Packets.

The terms used in each embodiment should be interpreted broadly. For example, the term "processor" may encompass a general purpose processor, a central processing unit (CPU), a microprocessor, a digital signal processor (DSP), a controller, a microcontroller, a state machine, and so on. According to circumstances, a "processor" may refer to an application specific integrated circuit (ASIC), a field programmable gate array (FPGA), and a programmable logic device (PLD), etc. The term "processor" may refer to a combination of processing devices such as a plurality of microprocessors, a combination of a DSP and a microprocessor, or one or more microprocessors in conjunction with a DSP core.

As another example, the term "memory" may encompass any electronic component which can store electronic information. The "memory" may refer to various types of media such as a random access memory (RAM), a read-only memory (ROM), a programmable read-only memory (PROM), an erasable programmable read only memory (EPROM), an electrically erasable PROM (EEPROM), a non-volatile random access memory (NVRAM), a flash memory, and a magnetic or optical data storage, which are readable by a processor. It can be said that the memory electronically communicates with a processor if the processor read and/or write information for the memory. The memory may be arranged within a processor and also in this case, it can be said that the memory electronically communicates with the processor. The circuitry" may refer one or more electric circuits disposed on a single chip, or may refer one or more electric circuits disposed on a plurality of chips or a plurality of devices in a dispersed manner.

In the specification, the expression "at least one of a, b or c" is an expression to encompass not only "a", "b", "c", "a and b", "a and c", "b and c", "a, b and c" or any combination thereof but also a combination of at least a plurality of same elements such as "a and a", "a, b and b" or "a, a, b, b, c and c". Also, the expression is an expression to allow a set including an element other than "a", "b" and "c" such as "a, b, c, and d".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

The invention claimed is:

1. A wireless communication device comprising:
a receiver configured to receive a first frame which contains data; and
a transmitter configured to transmit a second frame and a third frame by frequency multiplexing, the third frame containing the data and being addressed to a first relay station different from a sender device of the first frame, wherein
the second frame is addressed to the sender device of the first frame and the first relay station,
the second frame is a frame to instruct the sender device of the first frame to perform an eighth frame transmission and to instruct the first relay station to perform a ninth frame transmission, and
the second frame specifies a first frequency resource used by the sender device of the first frame for the eighth frame transmission and a second frequency resource used by the first relay station for the ninth frame transmission.

2. The wireless communication device according to claim 1, wherein
the receiver is configured to receive a fourth frame transmitted in response to the second frame and a fifth frame transmitted in response to the third frame by frequency multiplexing.

3. The wireless communication device according to claim 2, wherein
the fifth frame is an acknowledgement response frame with respect to the third frame.

4. The wireless communication device according to claim 2, wherein
in a case where out-of-synchronization is detected between a reception timing of the fourth frame and a reception timing of the fifth frame, the transmitter is configured to transmit a seventh frame controlling a timing of frame transmission by the first relay station at a timing after elapse of a first time period from the reception timing of the fourth frame.

5. The wireless communication device according to claim 1, wherein
a resource amount of the first frequency resource is larger than a resource amount of the second frequency resource.

6. The wireless communication device according to claim 1, wherein
the transmitter is configured to transmit the second frame and an acknowledgement response frame with respect to the first frame by frequency multiplexing.

7. The wireless communication device according to claim 1, wherein
the transmitter is configured to transmit an aggregation frame in which the second frame and an acknowledgement response frame with respect to the first frame are aggregated.

8. The wireless communication device according to claim 1, wherein
the transmitter is configured to perform transmission using a first channel, and
the receiver is configured to perform reception using a second channel different from the first channel.

9. The wireless communication device according to claim 1, wherein
a number of hops of the wireless communication device from a wired network is larger than that of the first relay station and smaller than that of the sender device of the first frame.

10. The wireless communication device according to claim 1, further comprising at least one antenna.

11. A wireless communication device, comprising:
a receiver configured to receive a first frame which contains data; and
a transmitter configured to transmit a second frame and a third frame by frequency multiplexing, the third frame containing the data and being addressed to a first relay station different from a sender device of the first frame,
wherein the second frame is a frame to instruct the sender device of the first frame to perform a tenth frame transmission,
the transmitter is configured to transmit a sixth frame and the third frame by frequency multiplexing, the sixth frame instructing the first relay station to perform an eleventh frame transmission,
the second frame specifies a first frequency resource used by the sender device of the first frame for the tenth frame transmission, and
the sixth frame specifies a second frequency resource used by the first relay station for the eleventh frame transmission.

12. The wireless communication device according to claim 11, wherein
a resource amount of the first frequency resource is larger than a resource amount of the second frequency resource.

13. The wireless communication device according to claim 11, wherein
the transmitter is configured to transmit an aggregation frame in which the sixth frame and the third frame are aggregated.

14. A wireless communication method comprising:
receiving a first frame which contains data; and
transmitting a second frame and a third frame by frequency multiplexing, the third frame containing the data and being addressed to a first relay station different from a sender device of the first frame,
the second frame being addressed to the sender device of the first frame and the first relay station,
the second frame being a frame to instruct the sender device of the first frame to perform a thirteenth frame transmission and to instruct the first relay station to perform a fourteenth frame transmission, and
the second frame specifying a first frequency resource used by the sender device of the first frame for the thirteenth frame transmission and a second frequency resource used by the first relay station for the fourteenth frame transmission.

15. The wireless communication method according to claim 14, comprising:
receiving a fourth frame transmitted in response to the second frame and a fifth frame transmitted in response to the third frame by frequency multiplexing.

16. The wireless communication method according to claim 15, wherein
the fifth frame is an acknowledgement response frame with respect to the third frame.

17. A wireless communication method, comprising:
receiving a first frame which contains data; and
transmitting a second frame and a third frame by frequency multiplexing, the third frame containing the data and being addressed to a first relay station different from a sender device of the first frame,
the second frame being a frame to instruct the sender device of the first frame to perform a fifteenth frame transmission,
the method comprising transmitting a sixth frame and the third frame by frequency multiplexing, the sixth frame instructing the first relay station to perform a sixteenth frame transmission,
the second frame specifying a first frequency resource used by the sender device of the first frame for the fifteenth frame transmission, and
the sixth frame specifying a second frequency resource used by the first relay station for the sixteenth frame transmission.

\* \* \* \* \*